United States Patent
Kim et al.

(10) Patent No.: US 11,854,912 B2
(45) Date of Patent: Dec. 26, 2023

(54) SEMICONDUCTOR PACKAGE INCLUDING A CHIP PAD HAVING A CONNECTION PORTION AND TEST PORTION IN A FIRST SURFACE OF THE CHIP PAD

(71) Applicant: SAMSUNG ELECTRONICS CO., LTD., Suwon-si (KR)

(72) Inventors: Joonsung Kim, Suwon-si (KR); Yonghwan Kwon, Yongin-si (KR); Sanguk Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 284 days.

(21) Appl. No.: 17/196,538

(22) Filed: Mar. 9, 2021

(65) Prior Publication Data
US 2022/0068730 A1  Mar. 3, 2022

(30) Foreign Application Priority Data
Aug. 25, 2020 (KR) .................. 10-2020-0107423

(51) Int. Cl.
H01L 21/66 (2006.01)
H01L 23/00 (2006.01)
H01L 23/31 (2006.01)

(52) U.S. Cl.
CPC .......... *H01L 22/32* (2013.01); *H01L 23/3128* (2013.01); *H01L 24/05* (2013.01); *H01L 24/24* (2013.01); *H01L 2224/022* (2013.01); *H01L 2224/24226* (2013.01)

(58) Field of Classification Search
CPC ......... H01L 22/30; H01L 22/32; H01L 22/34; H01L 21/67288; H01L 24/02; H01L 24/05; H01L 24/13; H01L 24/20; H01L 24/24; H01L 24/96; H01L 23/481; H01L 2224/022; H01L 2224/24226; H01L 2224/04105; H01L 2224/12105; H01L 2224/02373; H01L 2224/02381; H01L 2224/13008; H01L 2924/181; H01L 2924/00012; H01L 23/16; H01L 23/485; H01L 23/49827; H01L 23/4334; H01L 23/3128; H01L 24/19; H01L 21/561; H01L 21/568; G01R 31/26
USPC ......................................................... 257/48
See application file for complete search history.

(56) References Cited

U.S. PATENT DOCUMENTS 6,844,631 B2  1/2005 Yong et al.
7,397,127 B2  7/2008 Lin et al.
7,834,453 B2 * 11/2010 Chang .................. H01L 22/32
                                                    257/784
8,143,693 B2 *  3/2012 Baek ................... H01L 23/3114
                                                    257/E21.135

(Continued)

FOREIGN PATENT DOCUMENTS

KR  10-1933408 B1  12/2018

*Primary Examiner* — Khiem D Nguyen
(74) *Attorney, Agent, or Firm* — Sughrue Mion, PLLC

(57) ABSTRACT

A semiconductor package is provided. The semiconductor package includes a chip pad of a semiconductor chip, the chip pad including a connection portion and a test portion in a first surface of the chip pad; a barrier layer covering the chip pad, the barrier layer defining a first opening and a second opening that is separate from the first opening, the first opening exposing the connection portion of the chip pad, and the second opening exposing the test portion of the chip pad; and a redistribution structure.

20 Claims, 22 Drawing Sheets

(56) References Cited

U.S. PATENT DOCUMENTS

| | | | |
|---|---|---|---|
| 9,006,724 B2* | 4/2015 | Jung | H01L 51/0031 |
| | | | 257/40 |
| 10,128,179 B2 | 11/2018 | Kim et al. | |
| 10,175,294 B2 | 1/2019 | Wu et al. | |
| 10,388,578 B2 | 8/2019 | Horibe et al. | |
| 2006/0060970 A1* | 3/2006 | Jeong | H01L 24/05 |
| | | | 257/E23.021 |
| 2008/0083992 A1* | 4/2008 | Lin | H01L 24/03 |
| | | | 257/774 |
| 2014/0361299 A1* | 12/2014 | Akiba | H01L 22/32 |
| | | | 257/48 |
| 2016/0274183 A1 | 9/2016 | Wu et al. | |
| 2017/0133309 A1* | 5/2017 | Kim | H01L 24/19 |
| 2017/0212167 A1* | 7/2017 | Wu | G01R 1/0416 |
| 2018/0240736 A1* | 8/2018 | Liu | H01L 24/06 |

* cited by examiner

SEMICONDUCTOR PACKAGE INCLUDING A CHIP PAD HAVING A CONNECTION PORTION AND TEST PORTION IN A FIRST SURFACE OF THE CHIP PAD

CROSS-REFERENCE TO THE RELATED APPLICATION

This application claims priority from Korean Patent Application No. 10-2020-0107423, filed on Aug. 25, 2020, in the Korean Intellectual Property Office, the disclosure of which is incorporated herein by reference in its entirety.

BACKGROUND

1. Field

Methods, apparatuses and systems consistent with example embodiments relate to a semiconductor package.

2. Related Art

Semiconductor packages may include a semiconductor chip, which includes a chip pad, and a redistribution structure, which includes a redistribution pattern connected to the chip pad and a redistribution dielectric layer surrounding the redistribution pattern. There is a need to increase the structural reliability between the chip pad of the semiconductor chip and the redistribution pattern of the redistribution structure.

SUMMARY

Example embodiments provide a semiconductor package with an increased structural reliability between a chip pad and a redistribution via pattern.

Example embodiments also provide a semiconductor package including a semiconductor chip selected as a non-defective product.

According to an aspect of an example embodiment, there is provided a semiconductor package including a chip pad of a semiconductor chip, the chip pad including a connection portion and a test portion in a first surface of the chip pad; a barrier layer covering the chip pad, the barrier layer defining a first opening and a second opening that is separate from the first opening, the first opening exposing the connection portion of the chip pad, and the second opening exposing the test portion of the chip pad; and a redistribution structure connected to the chip pad and including a redistribution dielectric layer, a redistribution via pattern, and a redistribution line pattern, the redistribution dielectric layer covering the chip pad and the barrier layer, the redistribution via pattern passing through at least a portion of the redistribution dielectric layer in a vertical direction, filling the first opening and being in contact with the connection portion of the chip pad, and the redistribution line pattern extending in the redistribution dielectric layer in a horizontal direction and being connected to the redistribution via pattern.

According to an aspect of an example embodiment, there is provided a semiconductor package including a chip pad of a semiconductor chip, the chip pad including a connection portion and a test portion in a first surface of the chip pad; a barrier layer covering the chip pad, the barrier layer defining a first opening and a second opening that is separate from the first opening, the first opening exposing the connection portion of the chip pad, and the second opening exposing the test portion of the chip pad; a capping layer provided on the barrier layer and filling the first opening and the second opening of the barrier layer; and a redistribution structure connected to the chip pad and including a redistribution dielectric layer, a redistribution via pattern, and a redistribution line pattern, the redistribution dielectric layer covering the barrier layer and the capping layer, the redistribution via pattern passing through at least a portion of the redistribution dielectric layer in a vertical direction and being in contact with a portion of the capping layer, and the redistribution line pattern extending in the redistribution dielectric layer in a horizontal direction and being connected to the redistribution via pattern.

According to an aspect of an example embodiment, there is provided a semiconductor package including a semiconductor chip including a semiconductor substrate, a chip pad provided on the semiconductor substrate and a barrier layer provided on the chip pad, a first surface of the chip pad including a connection portion and a test portion, a second surface of the chip pad that is opposite the first surface being in contact with an active layer of the semiconductor substrate, a concave test groove being formed in the test portion of the first surface, the barrier layer defining a first opening and a second opening that is separate from the first opening, the first opening exposing the connection portion of the chip pad, and the second opening exposing the test portion of the chip pad; a redistribution structure connected to the chip pad and including a redistribution dielectric layer, a redistribution via pattern, and a redistribution line pattern, the redistribution dielectric layer covering the chip pad and the barrier layer, the redistribution via pattern passing through at least a portion of the redistribution dielectric layer in a vertical direction and being electrically connected to the connection portion of the chip pad, and the redistribution line pattern extending in the redistribution dielectric layer in a horizontal direction and being electrically connected to the redistribution via pattern; and a molding layer provided on the redistribution structure and surrounding the semiconductor chip.

According to an example embodiment, a portion of a surface of a chip pad of a semiconductor chip of a semiconductor package may not be in direct contact with a redistribution dielectric layer, wherein the portion of the surface of the chip pad is adjacent to a redistribution via pattern. Accordingly, chloride ions in the redistribution dielectric layer may not permeate the chip pad, and therefore, the structural reliability of the chip pad and the redistribution via pattern may be enhanced.

According to an example embodiment, a semiconductor package may be manufactured through a test process for checking whether a semiconductor chip has reached a certain quality level. As a result, the semiconductor package may include a semiconductor chip selected as a non-defective product.

BRIEF DESCRIPTION OF THE DRAWINGS

The above and other objects and features will become more apparent from the following description of example embodiments with reference to the accompanying drawings in which.

DETAILED DESCRIPTION

Hereinafter, example embodiments will be described in detail with reference to the accompanying drawings.

Figure 1:
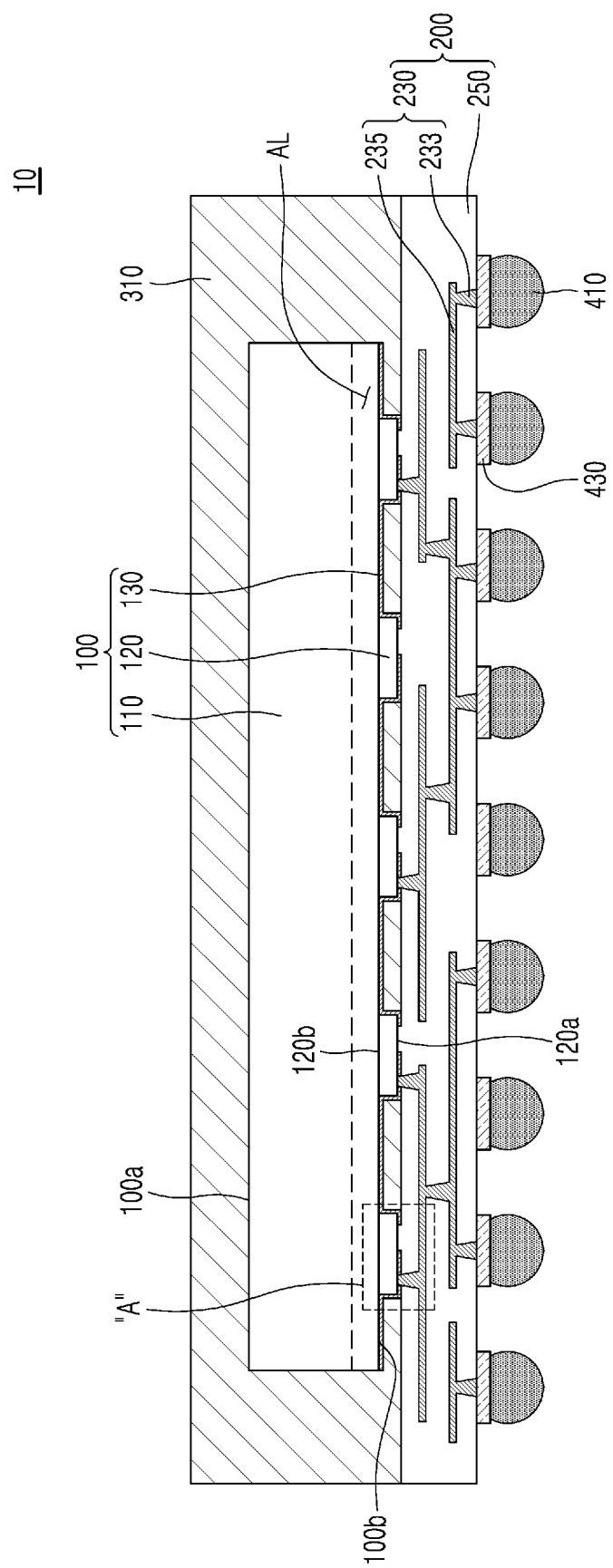
FIG. 1 is a cross-sectional view of a semiconductor package according to an example embodiment.
Figure 2:
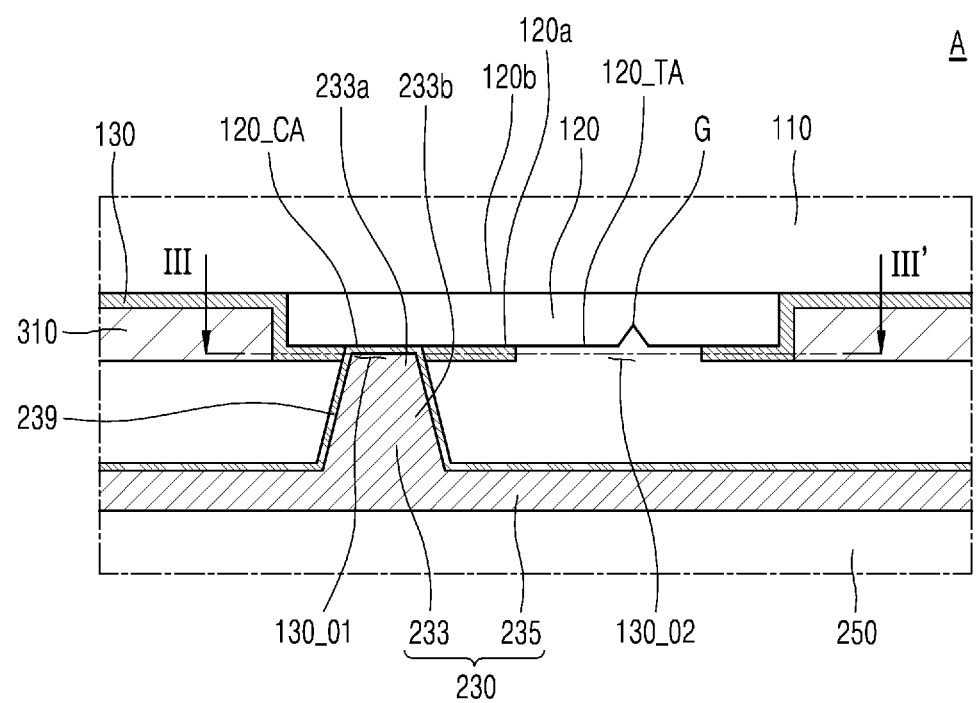
FIG. 2 is an enlarged view of region "A" in FIG. 1.
Figure 3:
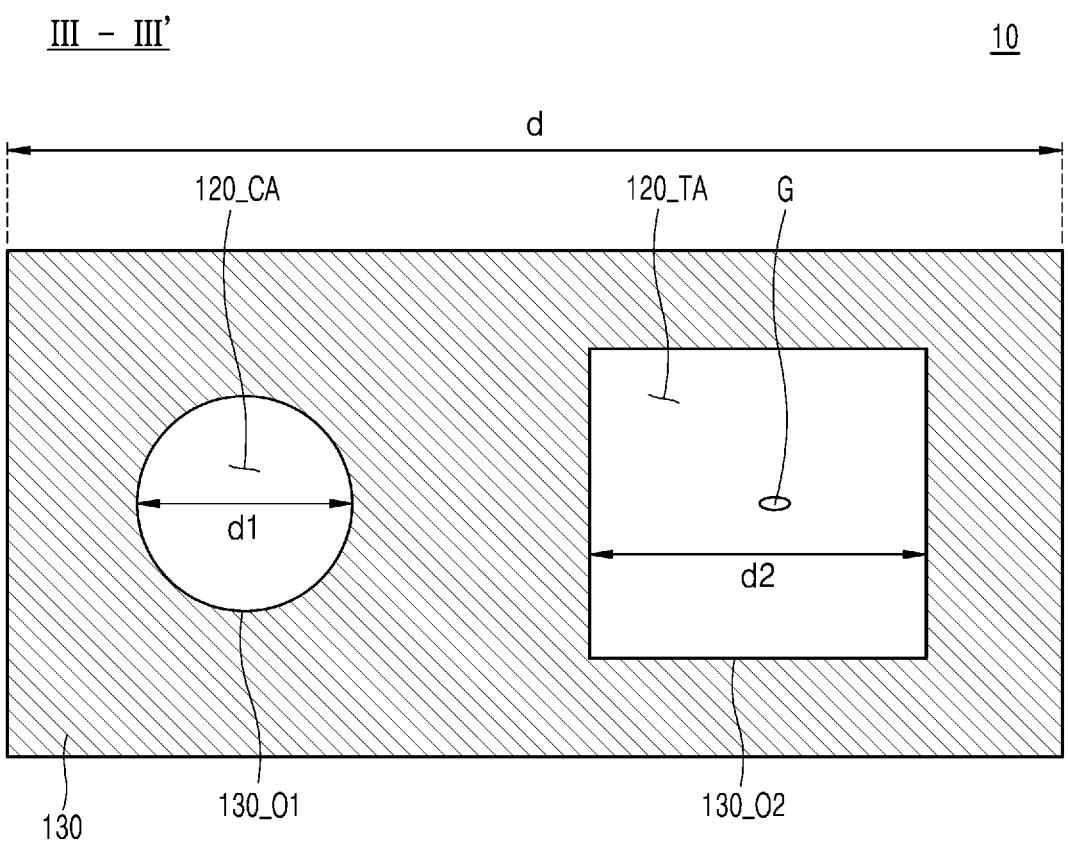
FIG. 3 is a plan view of a semiconductor package based on line in FIG. 2.

FIG. 1 is a cross-sectional view of a semiconductor package 10 according to an example embodiment. FIG. 2 is an enlarged view of region "A" in FIG. 1. FIG. 3 is a plan view of the semiconductor package 10 based on line III-III' in FIG. 2.

According to an example embodiment, the semiconductor package 10 may be manufactured at a wafer level or a panel level. According to an example embodiment, the semiconductor package 10 may have a fan-out structure in which at least one of a plurality of package connection terminals 410 is disposed beyond a side surface of a semiconductor chip 100. For example, the semiconductor package 10 may include a fan-out wafer-level package (FO-WLP) or a fan-out panel-level package (FO-PLP).

Referring to FIGS. 1 through 3, the semiconductor package 10 may include the semiconductor chip 100, a redistribution structure 200, a molding layer 310, and a package connection terminal 410.

The semiconductor chip 100 may include a semiconductor substrate 110, a chip pad 120, a barrier layer 130. The semiconductor chip 100 may have a top surface 100a and a bottom surface 100b. The chip pad 120 may be attached to the bottom surface 100b of the semiconductor chip 100, and the top surface 100a of the semiconductor chip 100 may be opposite the bottom surface 100b of the semiconductor chip 100.

In an example embodiment, the semiconductor chip 100 may include a logic semiconductor chip. The logic semiconductor chip may include, for example, a central processor unit (CPU), a microprocessor unit (MPU), a graphics processor unit (GPU), or an application processor (AP).

The semiconductor chip 100 may include a memory semiconductor chip. For example, the memory semiconductor chip may include a volatile memory semiconductor chip such as dynamic random access memory (DRAM) or static RAM (SRAM), or a non-volatile memory semiconductor chip such as phase-change RAM (PRAM), magneto-resistive RAM (MRAM), ferroelectric RAM (FeRAM) or resistive RAM (RRAM).

Although the semiconductor package 10 illustrated in FIG. 1 includes one semiconductor chip 100, embodiments are not limited thereto. For example, the semiconductor package 10 may include at least two semiconductor chips. For example, the semiconductor package 10 may include a plurality of semiconductor chips. The semiconductor package 10 may include a system-in-package (SiP), in which different types of semiconductor chips are electrically connected to each other and operate as a single system.

The semiconductor substrate 110 of the semiconductor chip 100 may include silicon (Si). The semiconductor substrate 110 may include a semiconductor element, e.g., germanium (Ge), or a compound semiconductor such as silicon carbide (SiC), gallium arsenide (GaAs), indium arsenide (InAs), or indium phosphide (InP). However, the material of the semiconductor substrate 110 is not limited to those above.

In an example embodiment, the semiconductor substrate 110 may include an active layer AL adjacent to the bottom surface 100b of the semiconductor chip 100. In other words, the active layer AL of the semiconductor chip 100 may be formed in a portion of the semiconductor substrate 110 adjacent to the redistribution structure 200.

In an example embodiment, the active layer AL may implement various kinds of individual devices. For example, the individual devices may include various microelectronic devices, e.g., a complementary metal-oxide-semiconductor (CMOS) transistor, a metal-oxide-semiconductor field effect transistor (MOSFET), a system large scale integration (LSI), an image sensor such as a CMOS image sensor (CIS), a micro-electro-mechanical system (MEMS), an active element, and a passive element.

The chip pad 120 of the semiconductor chip 100 may be on the bottom surface 100b of the semiconductor substrate 110 and may be electrically connected to the individual devices in the active layer AL. A plurality of chip pads 120 may be provided in the semiconductor chip 100.

In an example embodiment, each of the chip pads 120 may include a first surface 120a and a second surface 120b opposite the first surface 120a. In detail, the first surface 120a of the chip pad 120 may be in contact with the redistribution structure 200, and the second surface 120b of the chip pad 120 may be opposite the first surface 120a and be in contact with the semiconductor substrate 110.

In an example embodiment, in a plan view of a chip pad 120, the chip pad 120 may have a connection portion 120_CA and a test portion 120_TA in the first surface 120a.

In an example embodiment, a width "d" of the chip pad 120 may be about 60 micrometers to about 160 micrometers. The thickness of the chip pad 120 may be about 0.5 micrometers to about 3 micrometers. However, the width "d" and the thickness of the chip pad 120 are not limited to those above.

For example, each of the chip pads 120 may have both the connection portion 120_CA and the test portion 120_TA. However, embodiments are not limited thereto, and only some of the chip pads 120 may have both the connection portion 120_CA and the test portion 120_TA. The other chip pads 120 may have only either the connection portion 120_CA or the test portion 120_TA. For example, the other chip pads 120 may include the connection portion 120_CA but not the test portion 120_TA, or the other chip pads 120 may include the test portion 120_TA but not the connection portion 120_CA. Additionally, some of the other chip pads 120 may include the connection portion 120_CA but not the test portion 120_TA, while other chip pads 120 include the test portion 120_TA but not the connection portion 120_CA.

The connection portion 120_CA of a chip pad 120 may be a portion of the first surface 120a of the chip pad 120 for electrical connection between the chip pad 120 and a redistribution pattern 230 of the redistribution structure 200.

In an example embodiment, the connection portion 120_CA of the chip pad 120 may be a portion of the first surface 120a of the chip pad 120, which is surrounded by the barrier layer 130 and is in contact with a redistribution via pattern 233. The connection portion 120_CA of the chip pad 120 may be a portion of the first surface 120a of the chip pad 120, which is exposed by a first opening 130_O1 of the barrier layer 130.

In an example embodiment, the connection portion 120_CA of the chip pad 120 may have a circular shape in the plan view of the chip pad 120. For example, when the connection portion 120_CA has a circular shape, a width d1 of the connection portion 120_CA may be about 10 micrometers to about 50 micrometers. For example, the width d1 of the connection portion 120_CA may be about 20 micrometers.

The test portion 120_TA of the chip pad 120 may be a portion of the first surface 120a of the chip pad 120, which is provided at a side of the connection portion 120_CA. The test portion 120_TA may be separated from the connection portion 120_CA and may be used to determine whether the semiconductor chip 100 is non-defective.

In an example embodiment, the test portion 120_TA of the chip pad 120 may be a portion of the first surface 120a of the chip pad 120, which is surrounded by the barrier layer 130 and is in contact with a redistribution dielectric layer 250 of the redistribution structure 200. The test portion 120_TA of the chip pad 120 may be a portion of the first surface 120a of the chip pad 120, which is exposed by a second opening 130_O2 of the barrier layer 130.

In an example embodiment, the test portion 120_TA of the chip pad 120 may have a quadrangular shape in the plan view of the chip pad 120. For example, when the test portion 120_TA has a quadrangular shape, a width d2 of the test portion 120_TA may be about 40 micrometers to about 100 micrometers. For example, the width d2 of the test portion 120_TA may be about 44 micrometers to about 60 micrometers.

In an example embodiment, the chip pad 120 may include a test groove G in the test portion 120_TA. The test groove G may be generated by a probe device 777 (in FIG. 14) in a test process (e.g., an electrical dies sorting (EDS) process) for checking whether the quality of the semiconductor chip 100 has reached a certain level.

In an example embodiment, the test groove G may be formed in the test portion 120_TA of the chip pad 120 and may be concave from the first surface 120a toward the second surface 120b. The test groove G may be filled with the redistribution dielectric layer 250 of the redistribution structure 200.

In an example embodiment, the material of the chip pad 120 may include aluminum (Al). However, embodiments are not limited thereto. For example, the material of the chip pad 120 may include another metal, such as nickel (Ni), copper (Cu), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru), or an alloy thereof.

The barrier layer 130 of the semiconductor chip 100 may be conformally formed on the bottom surface 100b of the semiconductor chip 100 and the first surface 120a and side surface of the chip pad 120. The barrier layer 130 may cover the first surface 120a of the chip pad 120 to a thickness of about 0.3 micrometers to about 2.5 micrometers. For example, the thickness of the barrier layer 130 may be about 1 micrometer.

In an example embodiment, the barrier layer 130 may include a plurality of openings, e.g., the first opening 130_O1 and the second opening 130_O2, each of which partially exposes the first surface 120a of the chip pad 120. In detail, the barrier layer 130 may include the first opening 130_O1, which exposes the connection portion 120_CA of the chip pad 120, and the second opening 130_O2, which is provided at a side of the first opening 130_O1 to be separated from the first opening 130_O1 and exposes the test portion 120_TA of the chip pad 120.

In an example embodiment, in a plan view of the barrier layer 130, the first opening 130_O1 of the barrier layer 130 may have a circular shape and surround the edge of the connection portion 120_CA of the chip pad 120. The second opening 130_O2 of the barrier layer 130 may have a quadrangular shape and surround the edge of the test portion 120_TA of the chip pad 120.

In the plan view of the barrier layer 130, the size of the first opening 130_O1 of the barrier layer 130 may be less than the size of the second opening 130_O2 of the barrier layer 130. For example, in the plan view of the barrier layer 130, the cross-sectional area of the first opening 130_O1 of the barrier layer 130 may be less than the cross-sectional area of the second opening 130_O2 of the barrier layer 130.

In an example embodiment, the first opening 130_O1 of the barrier layer 130 may be filled with the redistribution via pattern 233 of the redistribution structure 200. Accordingly, the barrier layer 130 may surround a portion of the side surface of the redistribution via pattern 233.

The second opening 130_O2 of the barrier layer 130 may be filled with the redistribution dielectric layer 250 of the redistribution structure 200. Accordingly, the barrier layer 130 may surround a portion of the redistribution dielectric layer 250 of the redistribution structure 200.

In an example embodiment, the material of the barrier layer 130 may include silicon nitride (SiN). However, embodiments are not limited thereto. For example, the barrier layer 130 may include silicon oxynitride (SiON), silicon oxide ($SiO_2$), silicon oxycarbonitride (SiOCN), silicon carbonitride (SiCN), or a combination thereof.

In an example embodiment, in the plan view of the barrier layer 130, the width d1 of the first opening 130_O1 of the barrier layer 130 may be about 10 micrometers to about 50 micrometers. For example, the width d1 of the first opening 130_O1 of the barrier layer 130 may be about 20 micrometers.

In the plan view of the barrier layer 130, the width d2 of the second opening 130_O2 of the barrier layer 130 may be about 40 micrometers to about 100 micrometers.

The redistribution structure 200 may be electrically connected to the semiconductor chip 100 and may support the bottom surface 100b of the semiconductor chip 100. The redistribution structure 200 may include the redistribution pattern 230, which is electrically connected to the chip pad 120 of the semiconductor chip 100, and the redistribution dielectric layer 250, which surrounds the redistribution pattern 230.

In an example embodiment, in a plan view of the semiconductor package 10, the area of the redistribution structure 200 may be greater than the area of the semiconductor chip 100. A horizontal length of the redistribution structure 200 may be greater than a horizontal length of the semiconductor chip 100.

In an example embodiment, the redistribution dielectric layer 250 may include a photo-imageable dielectric (PID) material on which a photolithography process may be performed. For example, the redistribution dielectric layer 250 may include photosensitive polyimide (PSPI).

However, embodiments are not limited thereto. For example, the redistribution dielectric layer 250 may include an oxide or a nitride. For example, the redistribution dielectric layer 250 may include silicon oxide or silicon nitride.

In an example embodiment, the redistribution pattern 230 may include a conductive pattern electrically connected to the chip pad 120. For example, the redistribution pattern 230 may include the redistribution via pattern 233, which extends through the redistribution dielectric layer 250 in a vertical direction, and a redistribution line pattern 235, which extends through the redistribution dielectric layer 250 in a horizontal direction.

In an example embodiment, a plurality of redistribution line patterns 235 may be arranged in a plurality of layers in the redistribution dielectric layer 250 and may be electrically connected to each other through the redistribution via pattern 233.

In an example embodiment, some redistribution via patterns 233 may connect the chip pad 120 of the semiconductor chip 100 to the redistribution line pattern 235. Other redistribution via patterns 233 may connect a plurality of redistribution line patterns 235 to each other. Each of the other redistribution via patterns 233 may connect a redistribution line pattern 235 to a package connection pad 430.

In an example embodiment, a redistribution via pattern 233 may include a first portion 233a, which fills the first opening 130_O1 of the barrier layer 130 and is surrounded by the barrier layer 130. The first portion 233a of the redistribution via pattern 233 may be in contact with the connection portion 120_CA of the chip pad 120.

The redistribution via pattern 233 may include a second portion 233b surrounded by the redistribution dielectric layer 250. A horizontal cross-sectional area of the second portion 233b of the redistribution via pattern 233 may be greater than a horizontal cross-sectional area of the first portion 233a of the redistribution via pattern 233. The horizontal cross-sectional area of the second portion 233b of the redistribution via pattern 233 may be greater than a horizontal cross-sectional area of the first opening 130_O1 of the barrier layer 130. In other words, the redistribution via pattern 233 may have a tapered shape having a horizontal cross-sectional area decreasing toward the chip pad 120.

In an example embodiment, the material of the redistribution pattern 230 may include Cu. However, embodiments are not limited thereto. For example, the material of the redistribution pattern 230 may include metal, such as Ni, Au, Ag, Al, W, Ti, Ta, In, Mo, Mn, Co, Sn, Mg, Re, Be, Ga, or Ru, or an alloy thereof.

In an example embodiment, the redistribution pattern 230 may further include a redistribution seed layer 239 between the redistribution via pattern 233 and the redistribution dielectric layer 250 and between the redistribution line pattern 235 and the redistribution dielectric layer 250.

In an example embodiment, the redistribution seed layer 239 may be formed by performing physical vapor deposition, and the redistribution via pattern 233 and the redistribution line pattern 235 may be formed by performing a plating process.

In an example embodiment, the material of the redistribution seed layer 239 may include Ti, titanium tungsten (TiW), titanium nitride (TiN), Ta, tantalum nitride (TaN), chrome (Cr), Al, or a combination thereof.

For example, the structure of the redistribution pattern 230 and the redistribution seed layer 239 may include a Cu/Ti structure, in which Cu is stacked on Ti, or a Cu/TiW structure, in which Cu is stacked on TiW. However, the material of the redistribution seed layer 239 is not limited to those above.

When Cu is used for the redistribution via pattern 233 and the redistribution line pattern 235, at least a portion of the redistribution seed layer 239 may function as a diffusion barrier.

The molding layer 310 of the semiconductor package 10 may be on the redistribution structure 200 and may surround the semiconductor chip 100. The molding layer 310 may fix the semiconductor chip 100 to the redistribution structure 200.

The molding layer 310 may form the exterior of the semiconductor package 10 together with the redistribution structure 200. For example, a side surface of the molding layer 310 and a side surface of the redistribution structure 200 may form a side surface of the semiconductor package 10. A top surface of the molding layer 310 may form a top surface of the semiconductor package 10, and a bottom surface of the redistribution structure 200 may form a bottom surface of the semiconductor package 10. The side surface of the molding layer 310 may be coplanar with the side surface of the redistribution structure 200.

In an example embodiment, the molding layer 310 may be on the redistribution structure 200 and may surround the top surface 100a, the bottom surface 100b, and the side surface of the semiconductor chip 100. However, embodiments are not limited thereto, and in contrast to the example embodiment illustrated in FIG. 1, the molding layer 310 may be on the redistribution structure 200 and surround only the bottom surface 100b and the side surface of the semiconductor chip 100 but not the top surface 100a of the semiconductor chip 100. For example, one surface of the molding layer 310 may be coplanar with the top surface 100a of the semiconductor chip 100, and the top surface 100a of the semiconductor chip 100 may be exposed to the outside.

The molding layer 310 may include an epoxy molding compound (EMC). However, the material of the molding layer 310 is not limited to the EMC and may include various materials, such as, an epoxy-based material, a thermosetting material, a thermoplastic material, an ultraviolet (UV) curing material, and the like.

Figure 5:
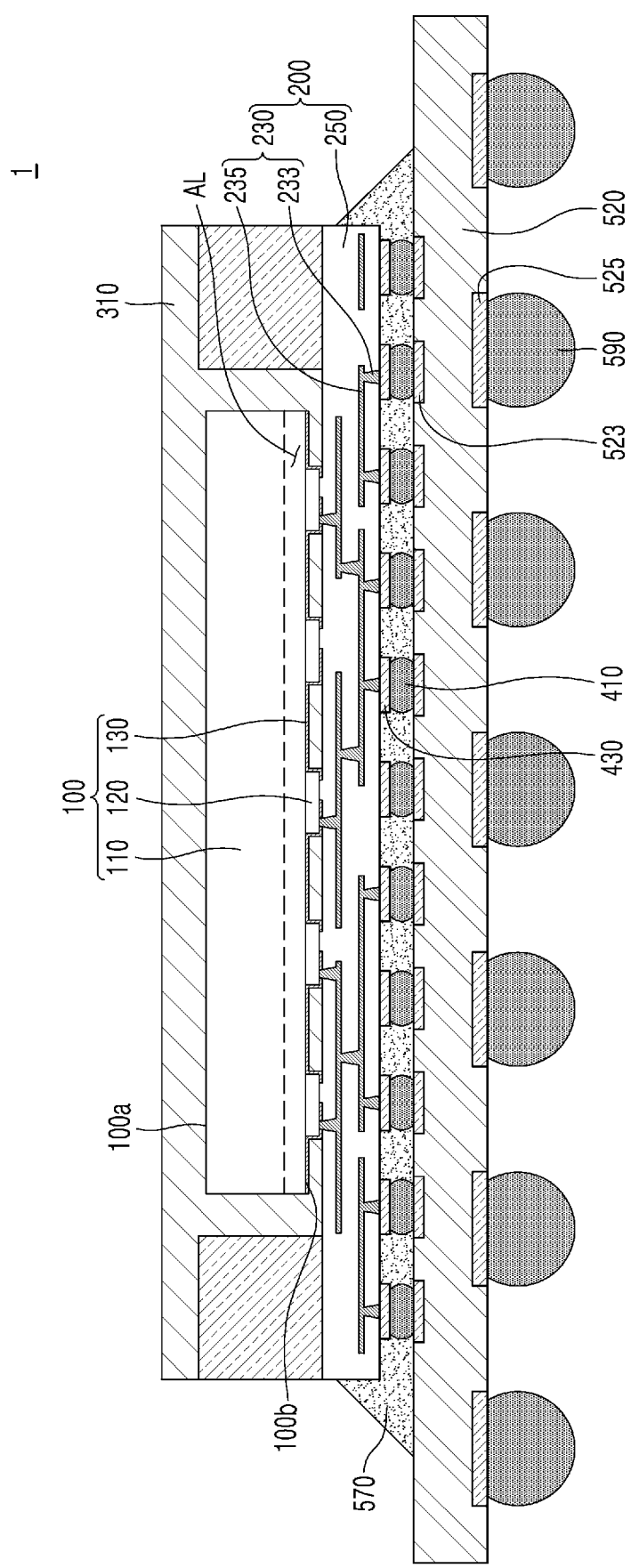
FIG. 5 is a cross-sectional view of a semiconductor device according to an example embodiment.

The package connection terminal 410 of the semiconductor package 10 may electrically connect the semiconductor package 10 to a package substrate 520 in FIG. 5. The package connection terminal 410 may be electrically connected to the semiconductor chip 100 through the package connection pad 430 attached to one surface of the redistribution structure 200.

In an example embodiment, the package connection pad 430 may be interposed between one surface of the redistribution structure 200 and the redistribution via pattern 233. The package connection pad 430 may function as under bump metallurgy (UBM), on which the package connection terminal 410 is arranged. One surface of the package connection pad 430 may be in contact with the redistribution via pattern 233, and an opposite surface of the package connection pad 430 may be in contact with the package connection terminal 410.

The material of the package connection pad 430 may include metal, such as Cu, Al, W, Ti, Ta, In, Mo, Mn, Co, Sn, Ni, Mg, Re, Be, Ga, or Ru, or an alloy thereof, but is not limited thereto.

In an example embodiment, the package connection terminal 410 may be attached to the package connection pad 430 and connected to the semiconductor chip 100 through the redistribution pattern 230. In detail, the package connection terminal 410 may be electrically connected to a plurality of individual devices in the active layer AL of the semiconductor chip 100 through the package connection pad 430, the redistribution pattern 230, and the chip pad 120.

In an example embodiment, the package connection terminal 410 may include a metal solder ball including any one or any combination of Sn, Ag, Cu, and Al.

In an example embodiment, at least one of a plurality of package connection terminals 410 may be disposed beyond a side surface of a semiconductor chip 100. In other words, at least one of the package connection terminals 410 may not overlap the semiconductor chip 100 in the vertical direction.

In an example embodiment, the barrier layer 130 of the semiconductor chip 100 may include a plurality of openings, e.g., the first opening 130_O1 and the second opening 130_O2, which partially expose the first surface 120a of the chip pad 120. In detail, the barrier layer 130 may include the first opening 130_O1, which exposes the connection portion 120_CA of the chip pad 120, so that a portion of the chip pad 120 may be electrically connected to the redistribution via pattern 233.

In addition, the barrier layer 130 may include the second opening 130_O2, which exposes the test portion 120_TA of the chip pad 120, so that a test process of the semiconductor chip 100 may be facilitated during the manufacture of the semiconductor package 10.

In other words, because the barrier layer 130 includes both the first opening 130_O1 and the second opening 130_O2 respectively exposing the connection portion 120_CA and the test portion 120_TA of the chip pad 120, both the electrical connection function and the quality test function of the semiconductor chip 100 may be performed via the chip pad 120.

Therefore, the semiconductor chip 100 of the semiconductor package 10 may be selected as a non-defective product.

The connection portion 120_CA of the chip pad 120 may be surrounded by the barrier layer 130, and the first opening 130_O1 of the barrier layer 130 surrounding the connection portion 120_CA may be filled with the redistribution via pattern 233. Accordingly, a portion of a surface of the chip pad 120 adjacent to the connection portion 120_CA may not be in direct contact with the redistribution dielectric layer 250.

The semiconductor package 10 may be mounted on the package substrate 520 in FIG. 5 and fixed to the package substrate 520 by an underfill layer 570 in FIG. 5. The underfill layer 570 may include chloride ions (Cl—).

In general, chloride ions in the underfill layer 570 may move to the redistribution dielectric layer 250 and permeate and corrode the chip pad 120, which includes a metal material. Accordingly, there is usually a risk that the structural reliability between the chip pad 120 and the redistribution via pattern 233 may be weakened.

According to an example embodiment, a portion of a surface of the chip pad 120 adjacent to the connection portion 120_CA may not be in direct contact with the redistribution dielectric layer 250. Accordingly, corrosion of the chip pad 120 may be prevented, and the structural reliability of the chip pad 120 and the redistribution via pattern 233 may be enhanced.

Figure 4:
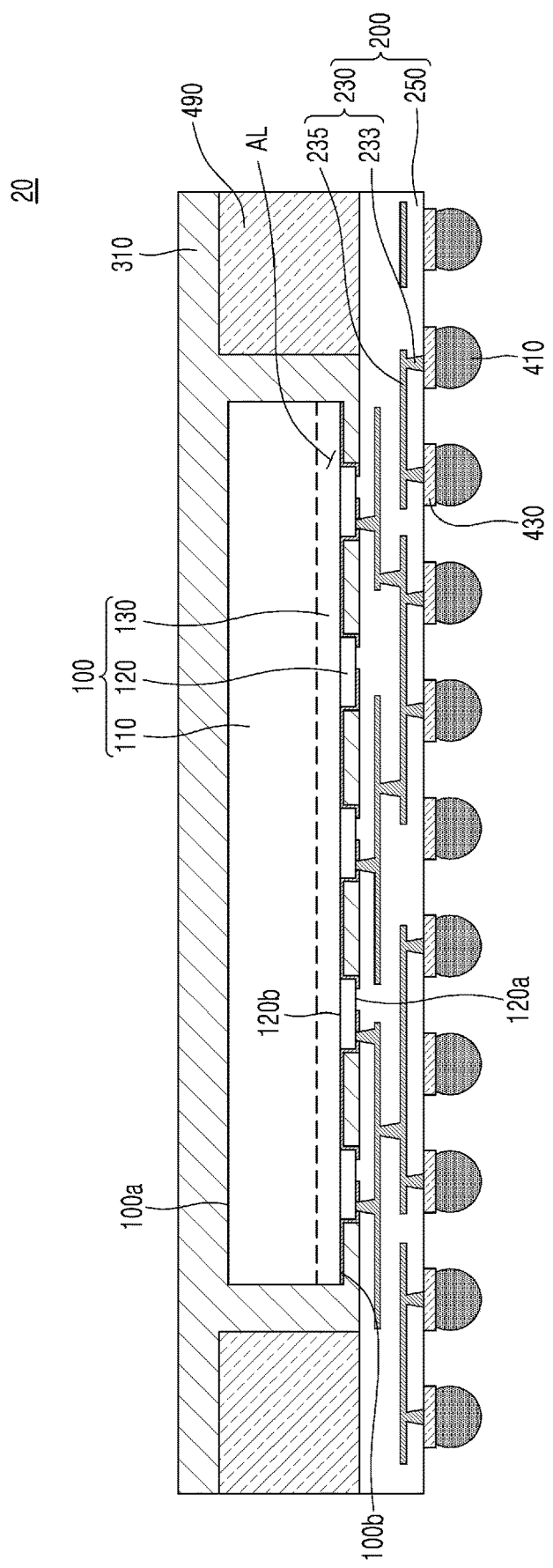
FIG. 4 is a cross-sectional view of a semiconductor package according to an example embodiment.

FIG. 4 is a cross-sectional view of a semiconductor package 20 according to an example embodiment.

Redundant descriptions given above with reference to FIGS. 1 through 3 will be omitted, and differences between the semiconductor package 20 of FIG. 4 and the semiconductor package 10 of FIGS. 1 through 3 will be focused in the description below.

The semiconductor package 20 of FIG. 4 may include the semiconductor chip 100, the redistribution structure 200, the molding layer 310, the package connection terminal 410, and an embedded frame 490. The semiconductor chip 100, the redistribution structure 200, the molding layer 310, and the package connection terminal 410 of the semiconductor package 20 of FIG. 4 have been described above with reference to FIGS. 1 through 3, and thus, detailed descriptions thereof will be omitted.

According to an example embodiment, the semiconductor package 20 may be manufactured at a panel level. For example, the semiconductor package 20 may include an FO-PLP.

In an example embodiment, the embedded frame 490 of the semiconductor package 20 may be on the redistribution structure 200 and surround the semiconductor chip 100. For example, an inner surface of the embedded frame 490 may surround the semiconductor chip 100, and an outer surface of the embedded frame 490 may be coplanar with the molding layer 310 and may be exposed to the outside.

In an example embodiment, during the manufacture of the semiconductor package 20, the embedded frame 490 may be prepared in a size of a panel level and then singulated to a size of the semiconductor package 20.

In an example embodiment, the material of the embedded frame 490 may include a polymer, such as resin, or a material, such as glass fabric. However, embodiments are not limited thereto. For example, the embedded frame 490 may include a metal material.

In an example embodiment, a thickness of the embedded frame 490 may be greater than a thickness of the semiconductor chip 100. In other words, a top surface of the embedded frame 490 may be at a higher level than the top surface 100a of the semiconductor chip 100. However, embodiments are not limited thereto. For example, the thickness of the embedded frame 490 may be less than the thickness of the semiconductor chip 100.

FIG. 5 is a cross-sectional view of a semiconductor device 1 according to an example embodiment.

The semiconductor device 1 of FIG. 5 may have a structure in which the semiconductor package 20 of FIG. 4 is mounted on the package substrate 520.

The semiconductor device 1 may include the semiconductor package 20, the package substrate 520, an external connection terminal 590, and the underfill layer 570.

The package substrate 520 of the semiconductor device 1 may connect the semiconductor package 20 to an external device. In an example embodiment, the package substrate 520 may include a double-sided printed circuit board (PCB) including a first package substrate pad 523 and a second package substrate pad 525. However, embodiments are not limited thereto. For example, the package substrate 520 may include a single-sided PCB including the first package substrate pad 523 in only one surface thereof.

In an example embodiment, the package substrate 520 is not limited to the structure and material of a PCB but may include various kinds of substrates including a ceramic substrate.

In an example embodiment, the package connection terminal 410 of the semiconductor package 20 may be between the package connection pad 430 of the semiconductor package 20 and the first package substrate pad 523 of the package substrate 520 and may electrically connect the semiconductor chip 100 to the package substrate 520.

The external connection terminal 590 may be attached to the second package substrate pad 525 of the package substrate 520 and may connect the semiconductor package 20 to an external device. For example, the external connection terminal 590 may include a metal solder ball including any one or any combination of Sn, Ag, Cu, and Al.

In an example embodiment, the underfill layer 570 may be configured to fix the semiconductor package 20 to the package substrate 520. The underfill layer 570 may be between the semiconductor package 20 and the package substrate 520 and may fix the semiconductor package 20 to the package substrate 520.

In an example embodiment, a portion of the underfill layer 570 may at least partially surround a side surface of the redistribution structure 200. The underfill layer 570 may have a tapered shape having a horizontal cross-sectional area increasing toward the package substrate 520.

In an example embodiment, the underfill layer 570 may include any one or any combination of an insulating polymer and epoxy resin. For example, the underfill layer 570 may include an EMC.

In an example embodiment, the underfill layer 570 may include chloride ions. For example, the underfill layer 570 may include at least 100 parts per million (ppm) chloride ions by weight.

Because the underfill layer 570 may be in contact with the redistribution dielectric layer 250, the chloride ions in the underfill layer 570 may move into the redistribution dielectric layer 250. The chloride ions may also move in the redistribution dielectric layer 250.

When the chloride ions permeate the chip pad 120, which includes a metal material, there is a risk that the chip pad 120 may corrode and that the structural reliability of the chip pad 120 and the redistribution via pattern 233 may be weakened.

According to an example embodiment, the edge of the connection portion 120_CA of the chip pad 120 may be surrounded by the barrier layer 130, and the first opening 130_O1 (i.e., the central portion of the connection portion 120_CA of the chip pad 120) of the barrier layer 130 may be filled with the redistribution via pattern 233.

In other words, a portion of the surface of the chip pad 120 adjacent to the connection portion 120_CA may not be in direct contact with the redistribution dielectric layer 250. Chloride ions moving in the redistribution dielectric layer 250 may not permeate the chip pad 120, and accordingly, the chip pad 120 may be prevented from corroding and the structural reliability of the chip pad 120 and the redistribution via pattern 233 may be enhanced.

Figure 6:
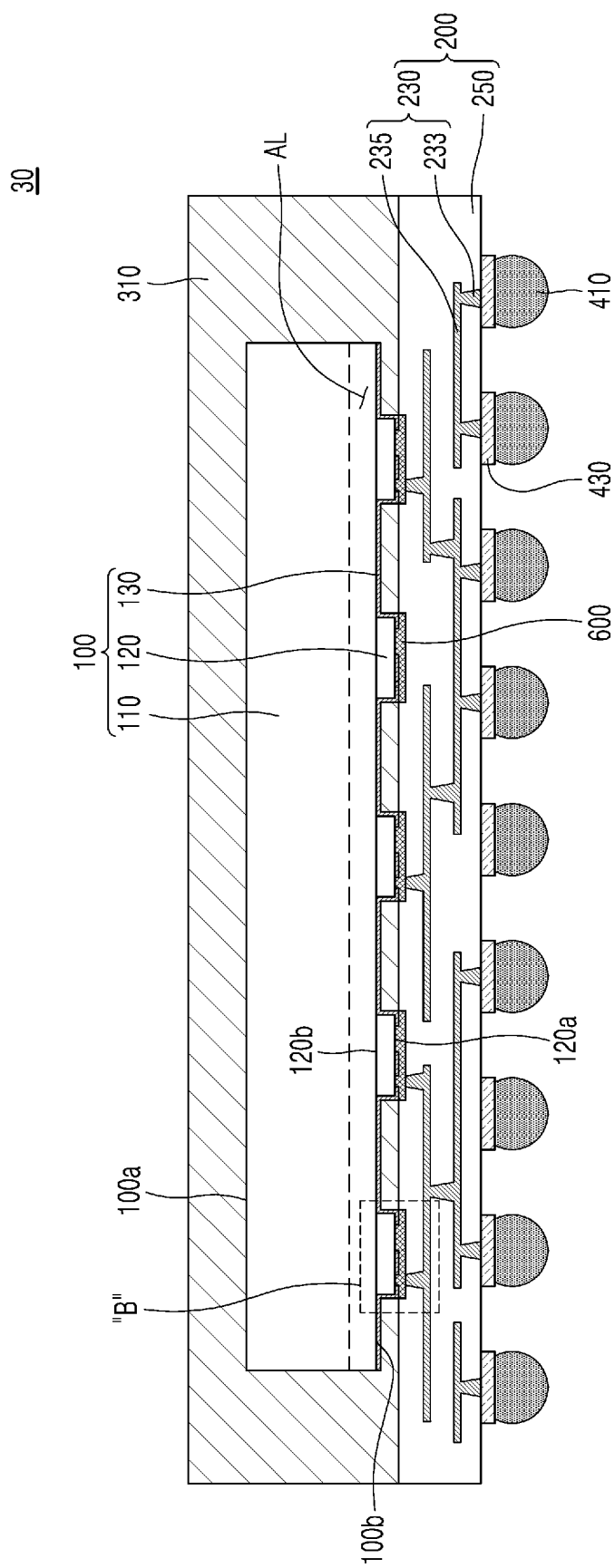
FIG. 6 is a cross-sectional view of a semiconductor package according to an example embodiment.
Figure 7:
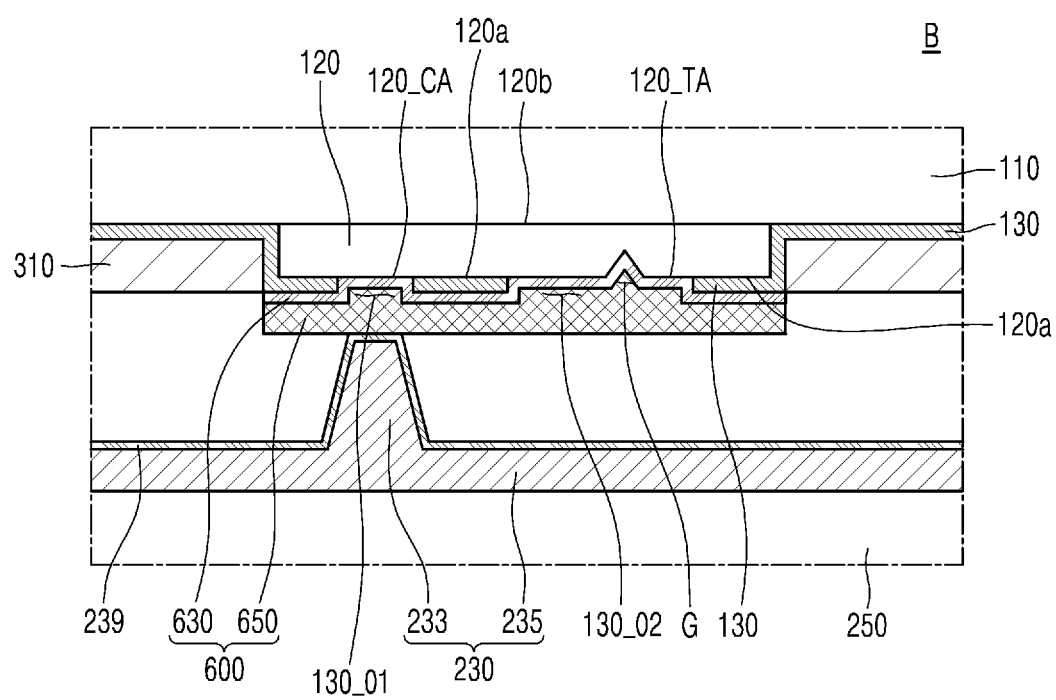
FIG. 7 is an enlarged view of region "B" in FIG. 6.

FIG. 6 is a cross-sectional view of a semiconductor package 30 according to an example embodiment, and FIG. 7 is an enlarged view of region "B" in FIG. 6.

According to an example embodiment, the semiconductor package 30 may include the semiconductor chip 100, the redistribution structure 200, the molding layer 310, a capping layer 600, and the package connection terminal 410. Redundant descriptions given above with reference to FIGS. 1 through 3 will be omitted, and differences between the semiconductor package 30 of FIGS. 6 and 7 and the semiconductor package 10 of FIGS. 1 through 3 will be focused in the description below.

According to an example embodiment, the semiconductor package 30 may further include the capping layer 600 on the barrier layer 130 of the semiconductor chip 100 as compared to the semiconductor package 10. For example, the capping layer 600 may be interposed between the barrier layer 130 and the redistribution dielectric layer 250, and between the barrier layer 130 and the redistribution via pattern 233.

In an example embodiment, the capping layer 600 may be on the barrier layer 130 and may fill the first opening 130_O1 and the second opening 130_O2 of the barrier layer 130.

A thickness of the capping layer 600 may be defined as a length from the first surface 120a of the chip pad 120 to a topmost surface of the capping layer 600 in the vertical direction. In an example embodiment, the thickness of the capping layer 600 may be about 1 micrometer to about 5 micrometers.

For example, the capping layer 600 may fill the first opening 130_O1 of the barrier layer 130 so that a portion of the capping layer 600 may be in contact with the connection portion 120_CA of the chip pad 120 and surrounded by the barrier layer 130.

In addition, the capping layer 600 may fill the second opening 130_O2 of the barrier layer 130 so that a portion of the capping layer 600 may be in contact with the test portion 120_TA of the chip pad 120 and surrounded by the barrier layer 130. The capping layer 600 may also fill the test groove G in the test portion 120_TA.

In an example embodiment, a horizontal width of the capping layer 600 may be less than a horizontal width of the chip pad 120. In a plan view of the semiconductor package 30, a cross-sectional area of the capping layer 600 may be less than a cross-sectional area of the chip pad 120.

In an example embodiment, the capping layer 600 may include a capping seed layer 630 and a capping conductive layer 650. The capping seed layer 630 may be conformally formed on the chip pad 120 and the barrier layer 130. The capping conductive layer 650 may be on the capping seed layer 630 and may include a conductive material formed through a plating process using the capping seed layer 630.

In an example embodiment, the capping conductive layer 650 may include a material having less reactivity than the chip pad 120 of the semiconductor chip 100. The capping conductive layer 650 may be connected to the chip pad 120 and may have less reactivity than the chip pad 120 so that corrosion of the chip pad 120 may be suppressed.

For example, when the material of the chip pad 120 of the semiconductor chip 100 includes Al, the material of the capping conductive layer 650 may include Cu having less reactivity than Al.

However, embodiments are not limited thereto. For example, the material of the capping conductive layer 650 may include metal, such as Ni, Au, Ag, Al, W, Ti, Ta, In, Mo, Mn, Co, Sn, Mg, Re, Be, Ga, or Ru, or an alloy thereof.

In an example embodiment, the capping seed layer 630 may be formed by performing physical vapor deposition, and the capping conductive layer 650 may be formed by performing a plating process. In an example embodiment, the material of the capping seed layer 630 may include Ti, TiW, TiN, Ta, TaN, Cr, Al, or a combination thereof.

For example, the structure of the capping conductive layer 650 and the capping seed layer 630 may include a Cu/Ti structure, in which Cu is stacked on Ti, or a Cu/TiW structure, in which Cu is stacked on TiW. However, the materials of the capping conductive layer 650 and the capping seed layer 630 are not limited to those described above.

When Cu is used for the capping conductive layer 650, at least a portion of the capping seed layer 630 may function as a diffusion barrier.

In an example embodiment, the redistribution via pattern 233 of the redistribution structure 200 may be in contact with a portion of the capping conductive layer 650 of the capping layer 600. Because the capping layer 600 may fill the first opening 130_O1 of the barrier layer 130 and the redistribution via pattern 233 may be in contact with a portion of the barrier layer 130, the redistribution via pattern 233 may be electrically connected to the connection portion 120_CA of the chip pad 120.

Accordingly, a horizontal cross-sectional area of the redistribution via pattern 233 may not be influenced by the size of the first opening 130_O1 of the barrier layer 130. For example, the horizontal cross-sectional area of the redistribution via pattern 233 may be less than a horizontal cross-sectional area of the first opening 130_O1 of the barrier layer 130. However, embodiments are not limited thereto. For example, the horizontal cross-sectional area of the redistribution via pattern 233 may be greater than the horizontal cross-sectional area of the first opening 130_O1 of the barrier layer 130.

Because the capping layer 600 may fill the first opening 130_O1 of the barrier layer 130 and the redistribution via pattern 233 may be in contact with a portion of the barrier layer 130, a contact position between the redistribution via pattern 233 and the capping layer 600 may not be limited by the position of the first opening 130_O1 of the barrier layer 130.

Accordingly, in contrast to FIG. 7, the contact position between the redistribution via pattern 233 and the capping layer 600 may not overlap the first opening 130_O1 of the barrier layer 130 in the vertical direction. For example, the contact position between the redistribution via pattern 233 and the capping layer 600 may overlap the second opening 130_O2 of the barrier layer 130 in the vertical direction. However, as shown in FIG. 7, the contact position between the redistribution via pattern 233 and the capping layer 600 may overlap the first opening 130_O1 of the barrier layer 130 in the vertical direction.

Figure 8:
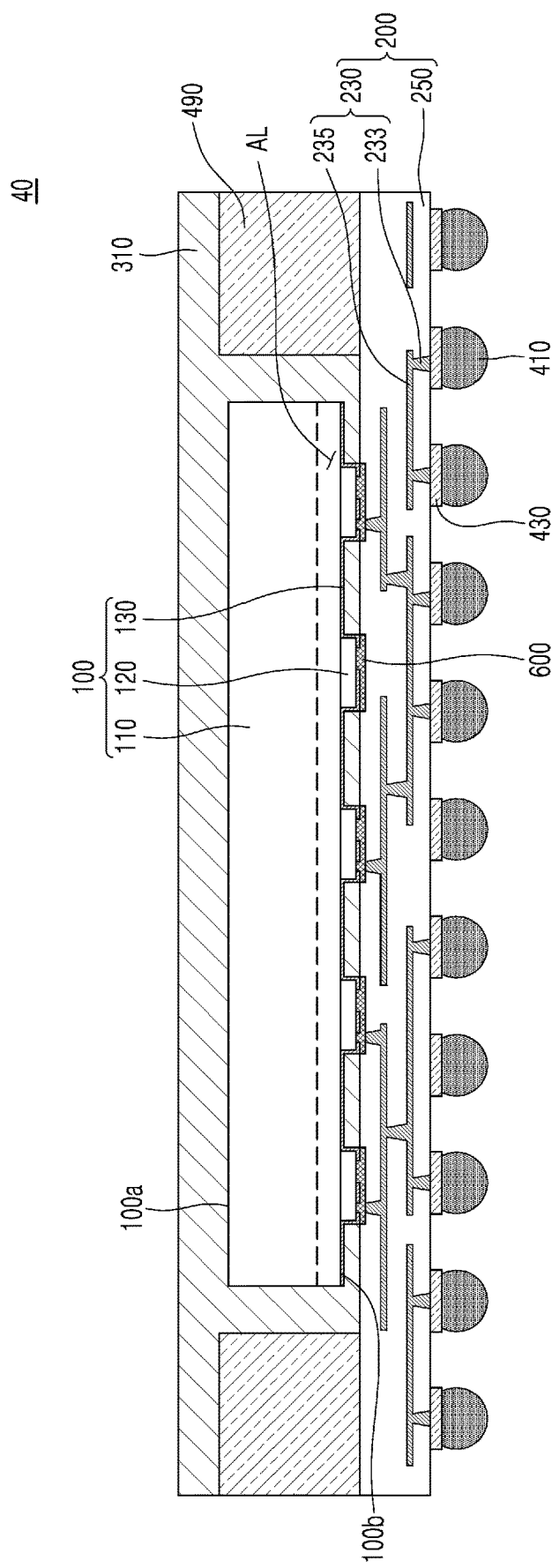
FIG. 8 is a cross-sectional view of a semiconductor package according to an example embodiment.

FIG. 8 is a cross-sectional view of a semiconductor package 40 according to an example embodiment.

Redundant descriptions given above with reference to FIGS. 6 and 7 will be omitted, and differences between the semiconductor package 40 of FIG. 8 and the semiconductor package 30 of FIGS. 6 and 7 will be focused in the description below.

The semiconductor package 40 of FIG. 8 may include the semiconductor chip 100, the redistribution structure 200, the molding layer 310, the package connection terminal 410, the capping layer 600, and the embedded frame 490.

According to an example embodiment, the semiconductor package 40 may be manufactured at a panel level. For example, the semiconductor package 40 may include an FO-PLP.

In an example embodiment, the embedded frame 490 of the semiconductor package 40 may be on the redistribution structure 200 and surround the semiconductor chip 100. For example, the inner surface of the embedded frame 490 may surround the semiconductor chip 100, and the outer surface of the embedded frame 490 may be coplanar with the molding layer 310 and may be exposed to the outside.

In an example embodiment, during the manufacture of the semiconductor package 40, the embedded frame 490 may be prepared in a size of a panel level and then singulated to the size of the semiconductor package 20.

In an example embodiment, the material of the embedded frame 490 may include a polymer, such as resin, or a material, such as glass fabric. However, embodiments are not limited thereto. For example, the embedded frame 490 may include a metal material.

In an example embodiment, the thickness of the embedded frame 490 may be greater than the thickness of the semiconductor chip 100. In other words, the top surface of the embedded frame 490 may be at a higher level than the top surface 100a of the semiconductor chip 100. However, embodiments are not limited thereto. For example, the thickness of the embedded frame 490 may be less than the thickness of the semiconductor chip 100.

Figure 9:
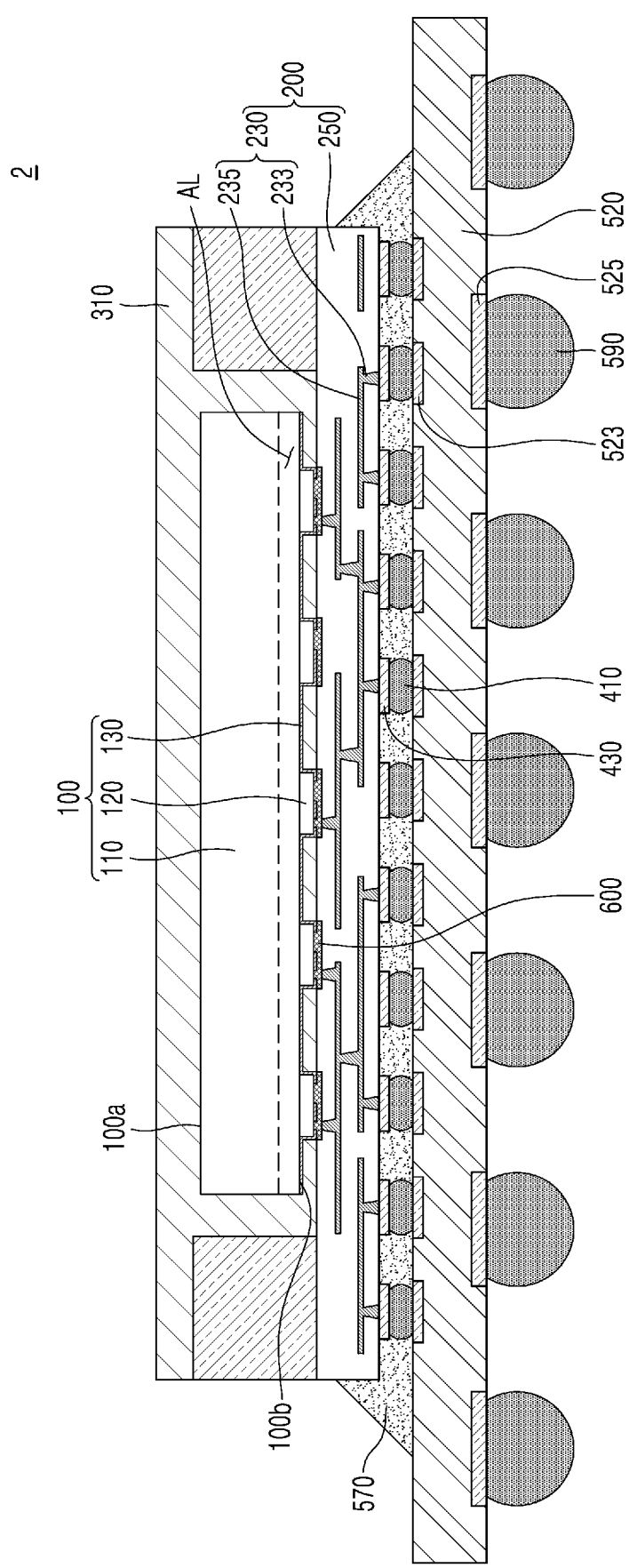
FIG. 9 is a cross-sectional view of a semiconductor device according to an example embodiment.

FIG. 9 is a cross-sectional view of a semiconductor device 2 according to an example embodiment.

The semiconductor device 2 of FIG. 9 may have a structure in which the semiconductor package 40 of FIG. 8 is mounted on the package substrate 520. The semiconductor device 2 may include the semiconductor package 40, the package substrate 520, the external connection terminal 590, and the underfill layer 570.

The package substrate 520 of the semiconductor device 2 may connect the semiconductor package 40 to an external device. In an example embodiment, the package substrate 520 may include a double-sided PCB including the first package substrate pad 523 and the second package substrate pad 525.

The package substrate 520 is not limited to the structure and material of a PCB but may include various kinds of substrates including a ceramic substrate.

In an example embodiment, the package connection terminal 410 of the semiconductor package 40 may be between the package connection pad 430 of the semiconductor package 40 and the first package substrate pad 523 of the package substrate 520 and may electrically connect the semiconductor chip 100 to the package substrate 520.

The external connection terminal 590 may be attached to the second package substrate pad 525 of the package substrate 520 and may connect the semiconductor package 40 to an external device. For example, the external connection terminal 590 may include a metal solder ball including any one or any combination of Sn, Ag, Cu, and Al.

In an example embodiment, the underfill layer 570 may fix the semiconductor package 40 to the package substrate 520. The underfill layer 570 may be between the semiconductor package 40 and the package substrate 520 and may fix the semiconductor package 40 to the package substrate 520.

In an example embodiment, the underfill layer 570 may include any one or any combination of an insulating polymer and epoxy resin. For example, the underfill layer 570 may include an EMC.

In an example embodiment, the underfill layer 570 may include chloride ions. For example, the underfill layer 570 may include at least 100 ppm chloride ions by weight.

Because the underfill layer 570 may be in contact with the redistribution dielectric layer 250, the chloride ions in the underfill layer 570 may move into the redistribution dielectric layer 250. The chloride ions may also move in the redistribution dielectric layer 250. When the chloride ions permeate the chip pad 120, which includes a metal material, there is a risk that the chip pad 120 may corrode and that the structural reliability of the chip pad 120 and the redistribution via pattern 233 may be weakened.

According to an example embodiment, the edge of the connection portion 120_CA of the chip pad 120 may be surrounded by the barrier layer 130, and the first opening 130_O1 (i.e., the central portion of the connection portion 120_CA of the chip pad 120) of the barrier layer 130 may be filled with the capping layer 600. In other words, the connection portion 120_CA of the chip pad 120 may not be in direct contact with the redistribution dielectric layer 250.

Chloride ions moving in the redistribution dielectric layer 250 may be blocked by the capping layer 600 and may not permeate the chip pad 120, and accordingly, the chip pad 120 may be prevented from corroding and the structural reliability of the chip pad 120 and the redistribution via pattern 233 may be enhanced.

A method S100 of manufacturing the semiconductor device 1, according to an example embodiment, will be described in detail below. Specifically, the method S100 may include a method of manufacturing the semiconductor device 1 including the semiconductor package 20, which has been described above with reference to FIG. 5.

Figure 10:
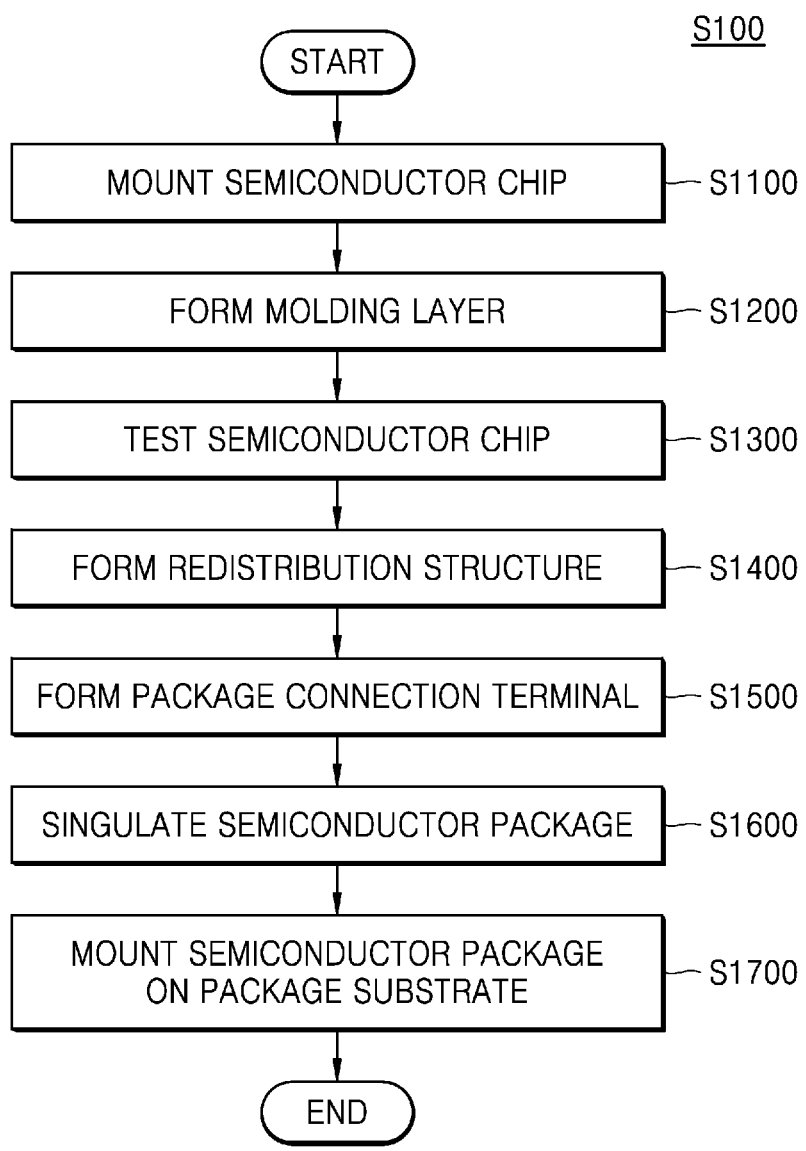
FIG. 10 is a flowchart of a method of manufacturing a semiconductor device, according to an example embodiment.

FIG. 10 is a flowchart of the method S100 of manufacturing the semiconductor device 1, according to an example embodiment. FIGS. 11 through 22 are cross-sectional views of stages in the method S100 of manufacturing the semiconductor device 1, according to an example embodiment.

In an example embodiment, the method S100 of manufacturing the semiconductor device 1 may include mounting the semiconductor package 20 on the package substrate 520 (in FIG. 23) after manufacturing the semiconductor package 20 at a panel level.

Referring to FIG. 10, the method S100 of manufacturing the semiconductor device 1 may include mounting the semiconductor chip 100 in operation S1100, forming the molding layer 310 in operation S1200, testing the semiconductor chip 100 in operation S1300, forming the redistribution structure 200 in operation S1400, forming the package connection terminal 410 in operation S1500, singulating the semiconductor package 20 in operation S1600, and mounting the semiconductor package 20 on the package substrate 520 in operation S1700.

Figure 11:
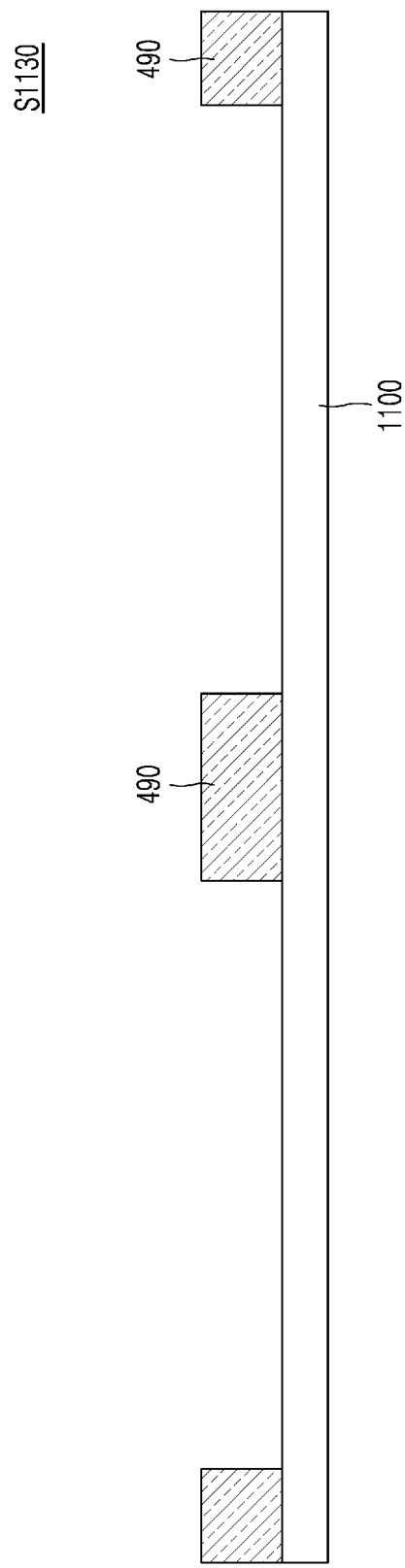
FIGS. 11 through 22 are cross-sectional views of stages in a method of manufacturing a semiconductor device, according to an example embodiment.
Figure 12:
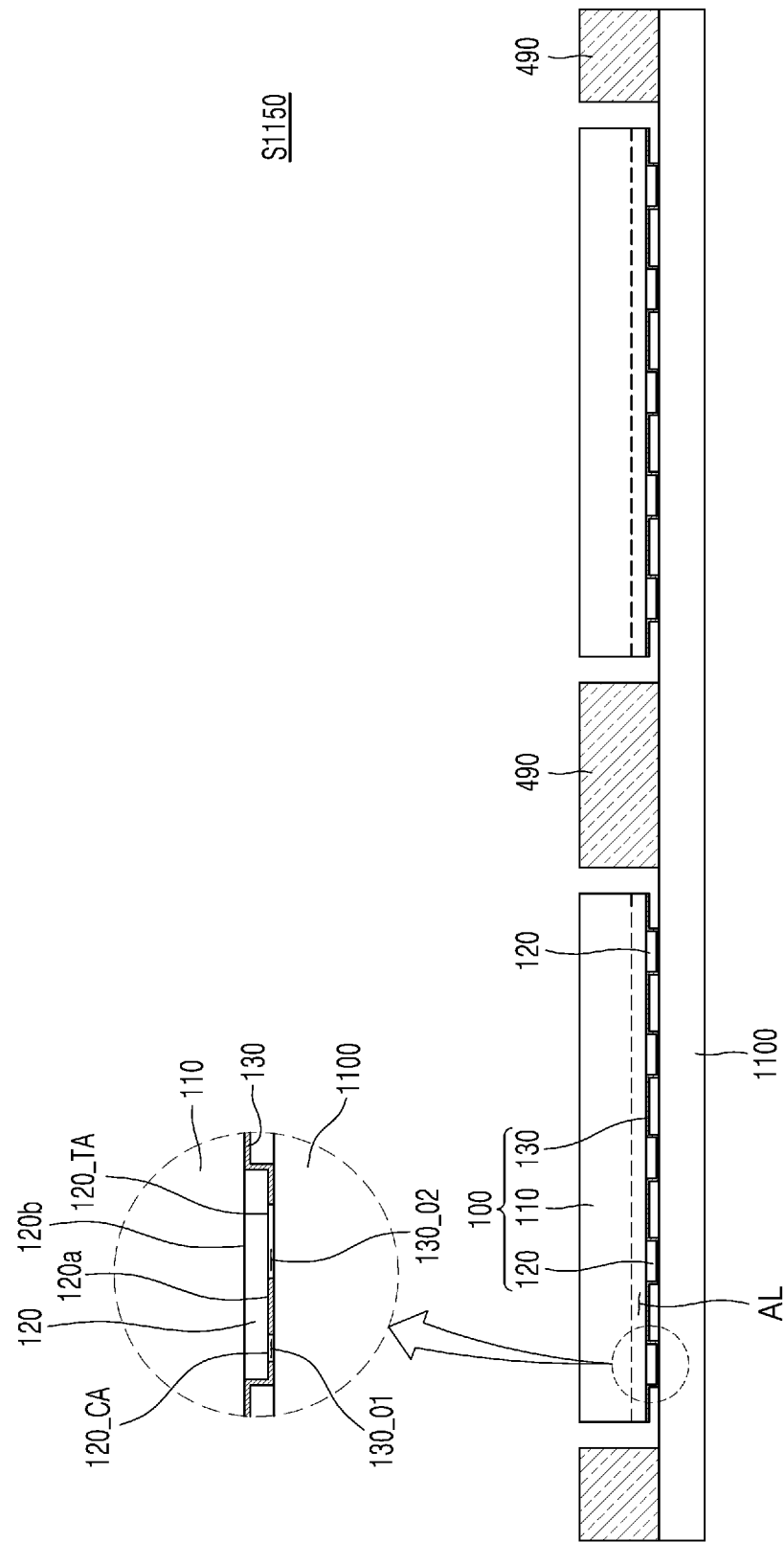

Referring to FIGS. 10 through 12, according to an example embodiment, the method S100 of manufacturing the semiconductor device 1 may include mounting the semiconductor chip 100 in operation S1100.

Operation S1100 may include mounting the embedded frame 490 on a carrier substrate 1100 in operation S1130 of FIG. 11 and mounting the semiconductor chip 100 in a hole of the embedded frame 490 in operation S1150 of FIG. 12.

However, embodiments are not limited thereto. For example, operation S1100 may include only mounting the semiconductor chip 100 in operation S1150 without mounting the embedded frame 490 in operation S1130.

The carrier substrate 1100 may include a material that has stability with respect to a baking process and an etching process. In the case where the carrier substrate 1100 is separated and then removed by laser ablation, the carrier substrate 1100 may include a transparent substrate. Optionally, in the case where the carrier substrate 1100 is separated and removed by heating, the carrier substrate 1100 may include a heat resistant substrate.

In example embodiments, the carrier substrate 1100 may include a glass substrate. In example embodiments, the carrier substrate 1100 may include heat resistant organic polymer material, such as polyimide (PI), polyetheretherketone (PEEK), polyethersulfone (PES), or polyphenylene sulfide (PPS), but is not limited thereto.

A release film may be attached to a surface of the carrier substrate 1100. For example, the release film may include a laser reactive layer that reacts to laser radiation and evaporates such that the carrier substrate 1100 is separable. The release film may include a carbon material layer. For example, the release film may include an amorphous carbon layer (ACL).

The embedded frame 490 may be mounted on the carrier substrate 1100 in operation S1130. In an example embodiment, the embedded frame 490 may be prepared in a size of a panel level. The embedded frame 490 may facilitate handling of a resultant structure of each of the stages in the method S100 of manufacturing the semiconductor device 1.

The embedded frame 490 may include a plurality of holes each surrounding a space which corresponds to a semiconductor chip 100. Each of the holes of the embedded frame 490 may provide a space in which the semiconductor chip 100 may be positioned.

The semiconductor chip 100 may be positioned in each of the holes of the embedded frame 490 in operation S1150. In detail, the semiconductor chip 100 may be positioned in each of the holes of the embedded frame 490 such that the active layer AL of the semiconductor chip 100 faces the carrier substrate 1100.

In operation S1150, the semiconductor chip 100 mounted on the carrier substrate 1100 may include the chip pad 120 and the barrier layer 130, which includes the first opening 130_O1 exposing the connection portion 120_CA of the chip pad 120 and the second opening 130_O2 exposing the test portion 120_TA of the chip pad 120.

Figure 13:
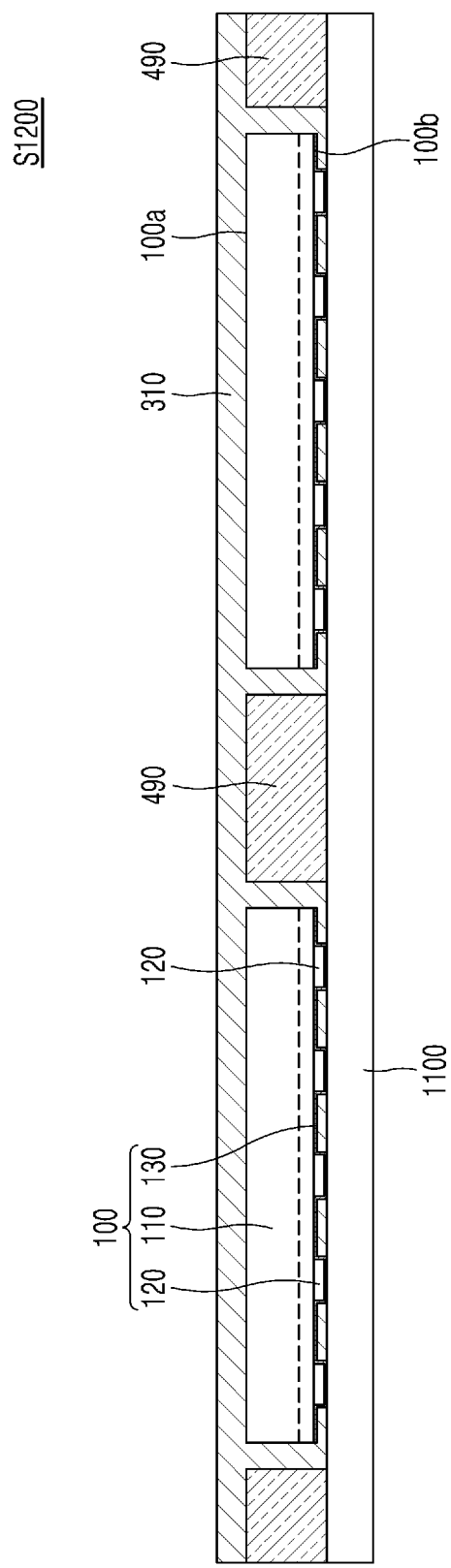

Referring to FIGS. 10 and 13, according to an example embodiment, the method S100 of manufacturing the semiconductor device 1 may include forming the molding layer 310 in operation S1200.

In operation S1200, the molding layer 310 may fill a space between the embedded frame 490 and the semiconductor chip 100. The molding layer 310 may also surround the top surface 100a, the bottom surface 100b, and the side surface of the semiconductor chip 100.

In an example embodiment, the molding layer 310 used in operation S1200 may include an EMC. However, the material of the molding layer 310 is not limited to the EMC but may include various materials, such as, an epoxy-based material, a thermosetting material, a thermoplastic material, a UV curing material, and the like.

The molding layer 310 may be partially ground in operation S1200. In an example embodiment, a top portion of the molding layer 310 may be ground such that the top surface 100a of the semiconductor chip 100 is exposed to the outside in operation S1200.

Accordingly, the size of the semiconductor device 1 manufactured by the method S100 may be reduced. In addition, because the top surface 100a of the semiconductor chip 100 of the semiconductor device 1 is exposed to the outside, the heat dissipation performance of the semiconductor device 1 may be enhanced.

Figure 14:
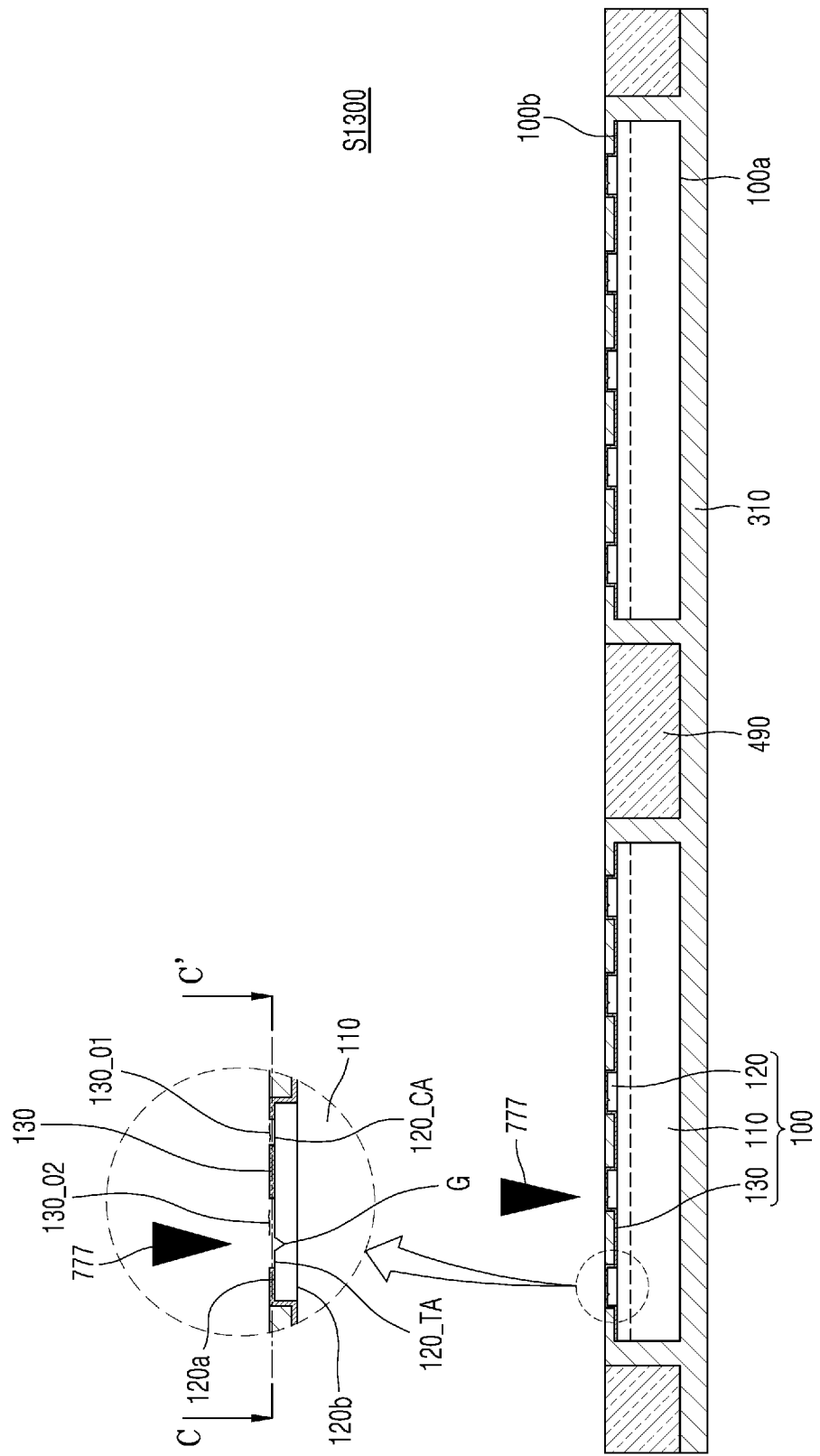
Figure 15:
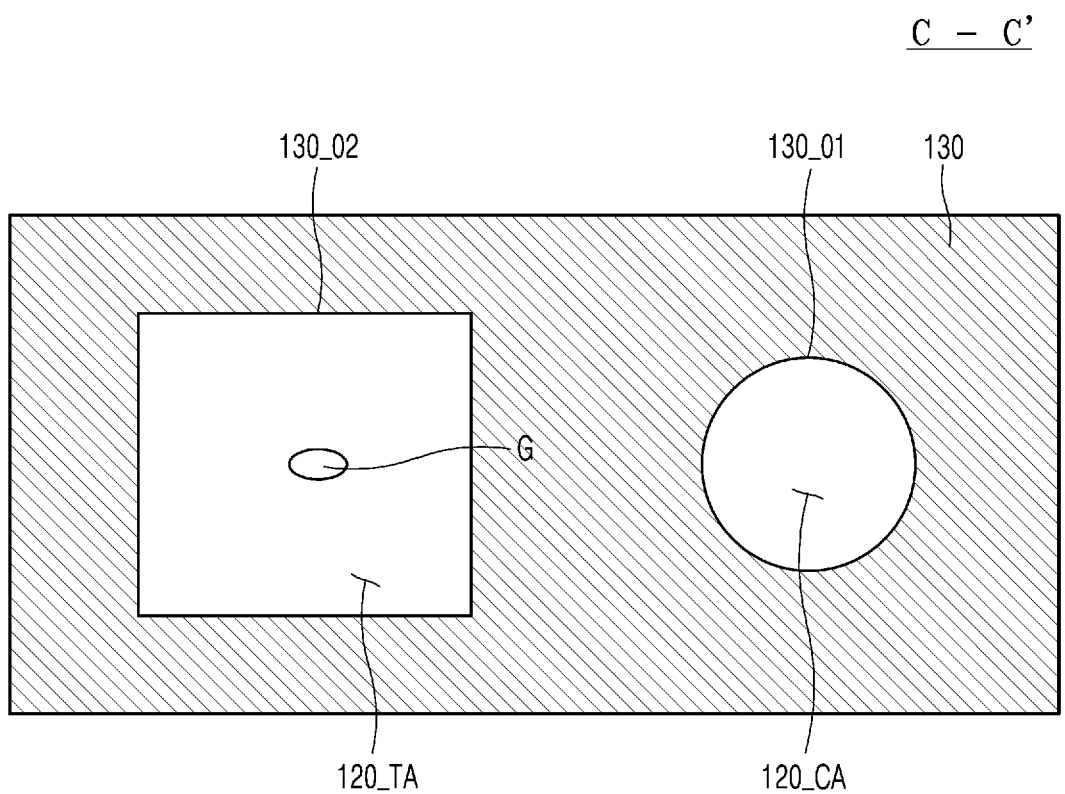

Referring to FIGS. 10, 14, and 15, according to an example embodiment, the method S100 of manufacturing the semiconductor device 1 may include testing the semiconductor chip 100 in operation S1300.

Before operation S1300, the carrier substrate 1100, which has been attached to the bottom surface 100b of the semiconductor chip 100, may be removed. In an example embodiment, the carrier substrate 1100 may be separated by laser ablation or heating.

Whether the semiconductor chip 100 has reached a certain quality level may be checked in operation S1300. For example, operation S1300 may include checking whether the semiconductor chip 100 is non-defective or defective, determining whether the semiconductor chip 100 is repairable when the semiconductor chip 100 is defective, and marking the semiconductor chip 100 when the semiconductor chip 100 is not repairable.

In an example embodiment, operation S1300 may include an electrical die sorting (EDS) process, in which current is supplied to the chip pad 120 of the semiconductor chip 100 using a probe device 777 and whether the semiconductor chip 100 has reached a certain quality level is checked.

As described above, according to an example embodiment, the barrier layer 130 of the semiconductor chip 100 may include the first opening 130_O1 exposing the connection portion 120_CA of the chip pad 120 and the second opening 130_O2 exposing the test portion 120_TA of the chip pad 120.

As shown in FIG. 15, the first opening 130_O1 of the barrier layer 130 may have a circular shape, and the second opening 130_O2 of the barrier layer 130 may have a quadrangular shape. However, the shapes of the first opening 130_O1 and the second opening 130_O2 of the barrier layer 130 are not limited those above.

In operation S1300, the probe device 777 may contact the test portion 120_TA of the chip pad 120 of the semiconductor chip 100 and supply current to the test portion 120_TA of the chip pad 120.

In an example embodiment, the probe device 777 may have a pin or needle shape. In operation S1300, the test groove G may be formed by the probe device 777 in the test portion 120_TA of the chip pad 120 when the probe device 777 contacts the test portion 120_TA of the chip pad 120.

Referring to FIG. 10 and FIGS. 16 through 18, according to an example embodiment, the method S100 of manufacturing the semiconductor device 1 may include forming the redistribution structure 200 in operation S1400.

Operation S1400 may include depositing the redistribution dielectric layer 250 on the semiconductor chip 100 and forming a hole H2 in the redistribution dielectric layer 250 in operation S1450 and forming the redistribution pattern 230 on the redistribution dielectric layer 250 in operation S1470.

Figure 16:
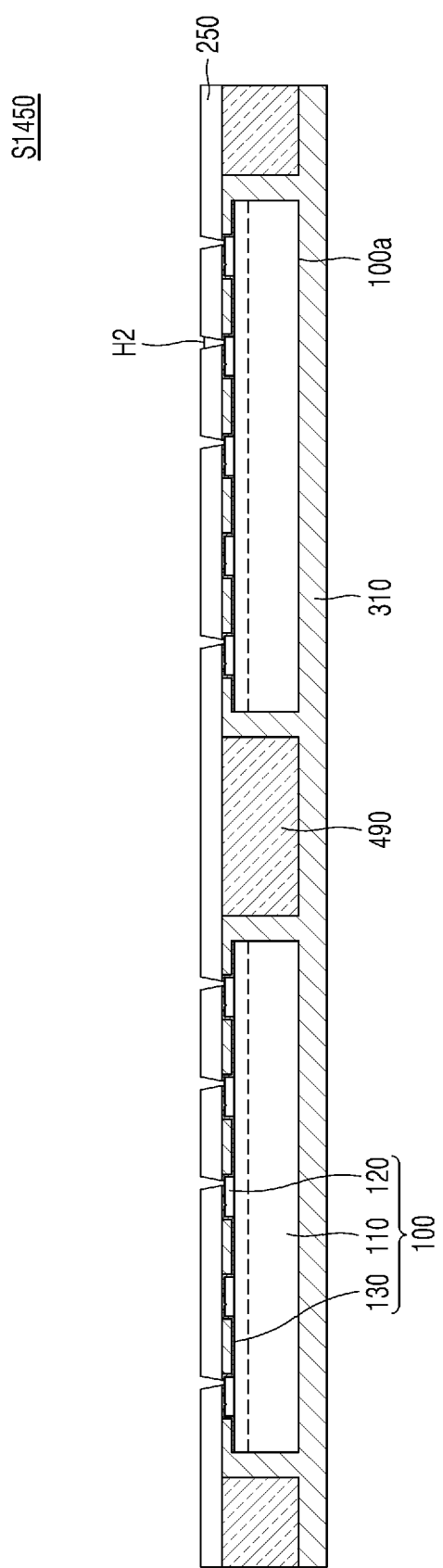

Referring to FIG. 16, the redistribution dielectric layer 250 may be deposited on the bottom surface 100b of the semiconductor chip 100. In an example embodiment, the redistribution dielectric layer 250 may be deposited on the bottom surface 100b of the semiconductor chip 100 to a uniform thickness using a spin coating process.

In an example embodiment, the redistribution dielectric layer 250 may include a PID material on which a photolithography process may be performed. For example, the redistribution dielectric layer 250 may include PSPI. However, embodiments are not limited thereto. For example, the redistribution dielectric layer 250 may include an oxide or a nitride. For example, the redistribution dielectric layer 250 may include silicon oxide or silicon nitride.

In an example embodiment, the hole H2 exposing the chip pad 120 of the semiconductor chip 100 may be formed in the redistribution dielectric layer 250 in operation S1450. For example, the hole H2 of the redistribution dielectric layer 250 may be formed using an etching process, a laser drilling process, or the like.

In an example embodiment, the hole H2 formed in the redistribution dielectric layer 250 in operation S1450 may overlap the connection portion 120_CA of the chip pad 120 of the semiconductor chip 100 in the vertical direction. In other words, the hole H2 of the redistribution dielectric layer 250 may expose the connection portion 120_CA of the chip pad 120 to the outside in operation S1450.

Figure 17:
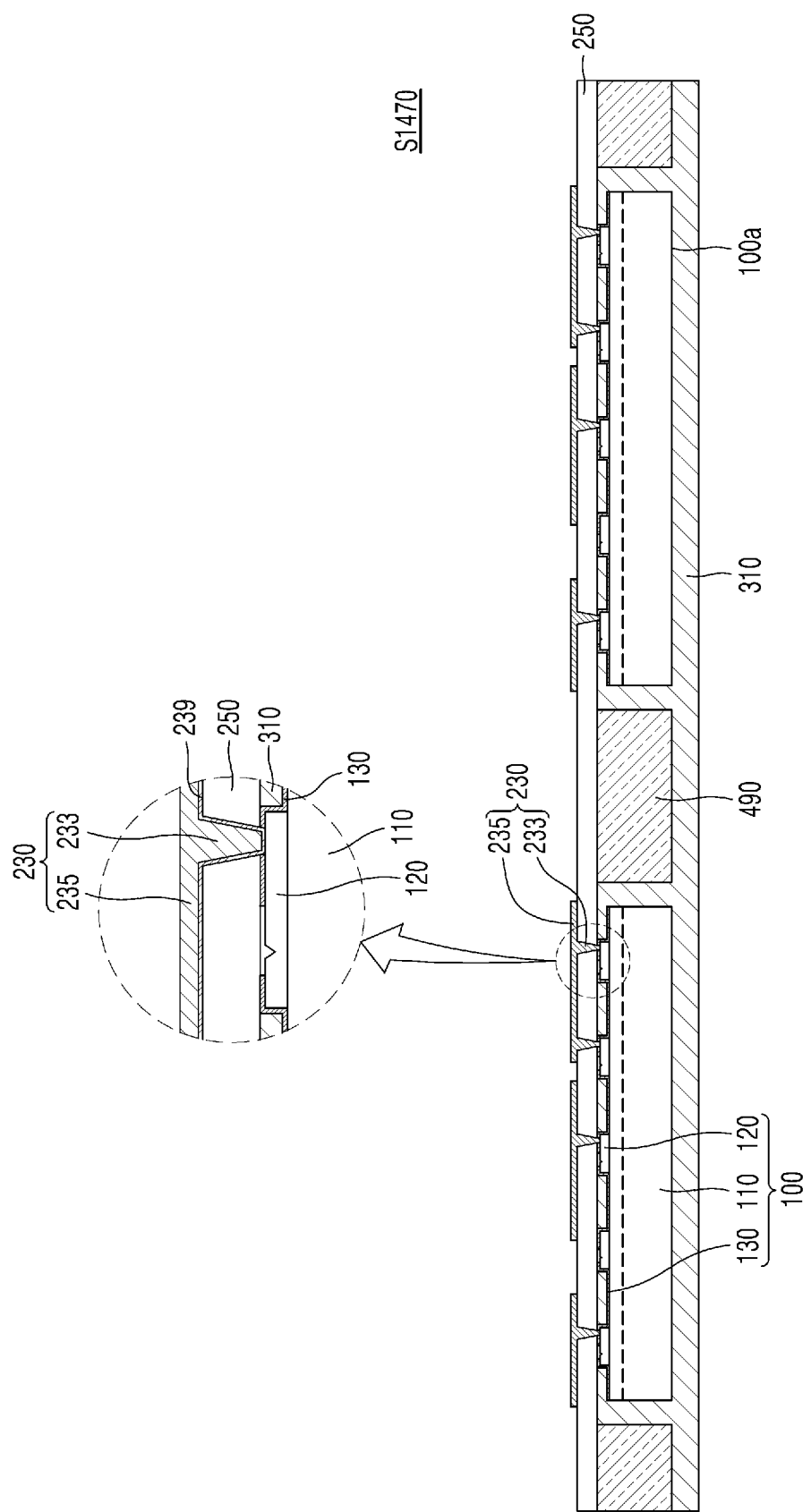

Referring to FIG. 17, the redistribution pattern 230 may be formed on the redistribution dielectric layer 250. In detail, the redistribution seed layer 239, the redistribution via pattern 233, and the redistribution line pattern 235 may be formed on the redistribution dielectric layer 250.

In an example embodiment, the redistribution seed layer 239 may be conformally formed on a surface of the redistribution dielectric layer 250. For example, the redistribution seed layer 239 may be formed on the surface of the redistribution dielectric layer 250 using physical vapor deposition.

In an example embodiment, the redistribution via pattern 233 and the redistribution line pattern 235 may be formed by a plating process using the redistribution seed layer 239. For example, the structure of the redistribution pattern 230 and the redistribution seed layer 239 may include a Cu/Ti structure, in which Cu is stacked on Ti, or a Cu/TiW structure, in which Cu is stacked on TiW. When Cu is used for the redistribution via pattern 233 and the redistribution line pattern 235, at least a portion of the redistribution seed layer 239 may function as a diffusion barrier.

Figure 18:
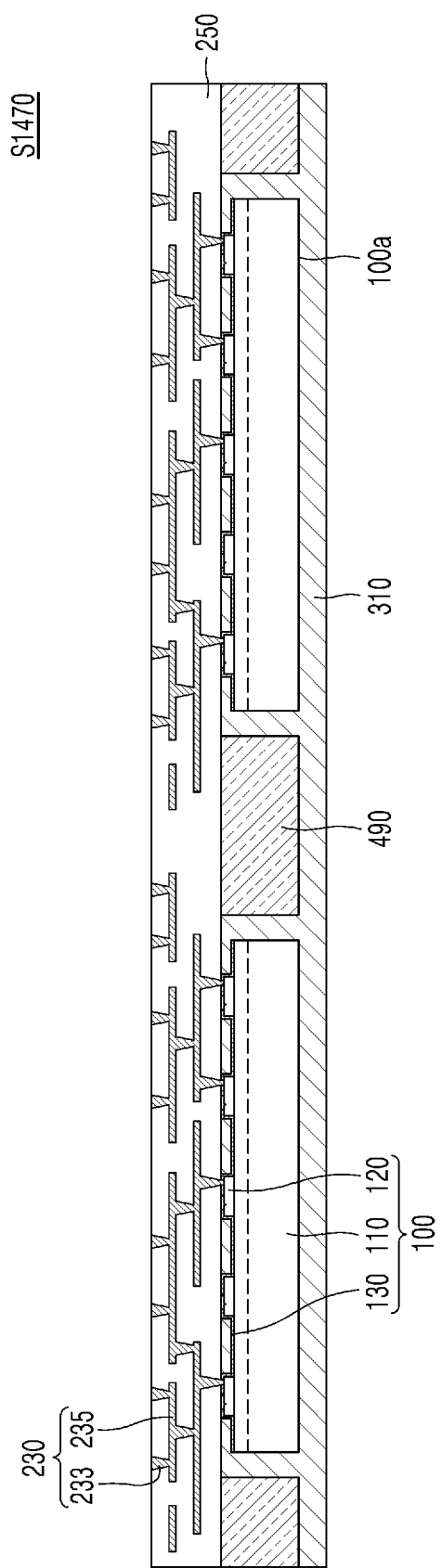

Referring to FIG. 18, the depositing of the redistribution dielectric layer 250 and the forming of the redistribution pattern 230 on the redistribution dielectric layer 250 may be repeated. Accordingly, redistribution patterns 230 may form a plurality of layers which may be electrically connected to each other by the redistribution via pattern 233.

Figure 19:
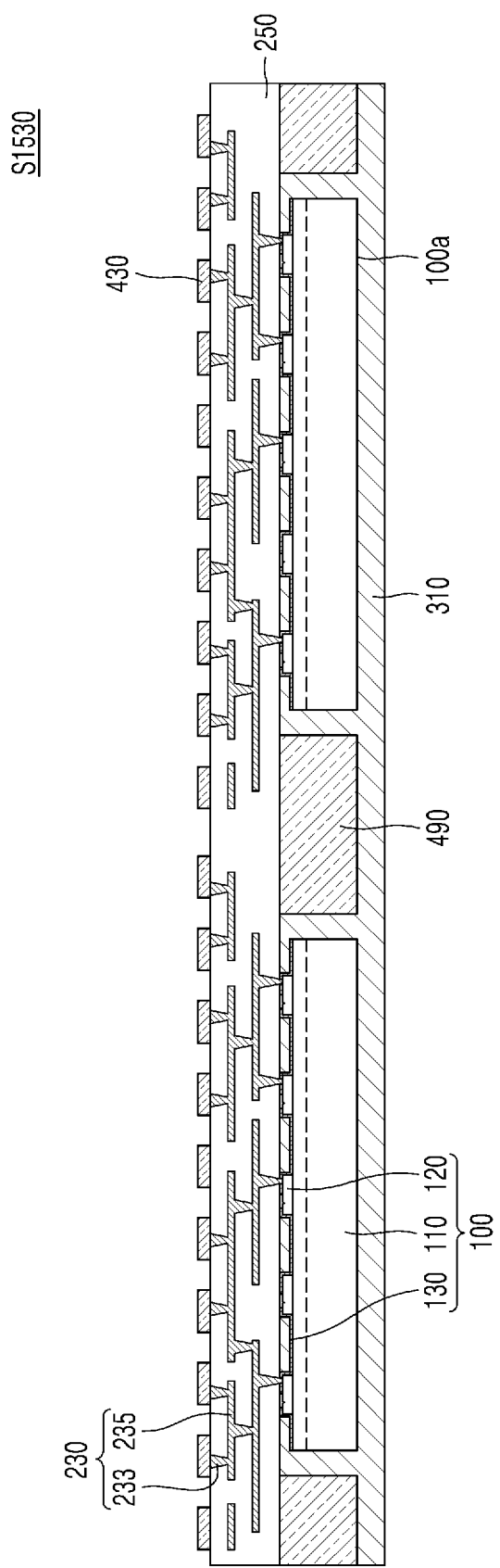
Figure 20:
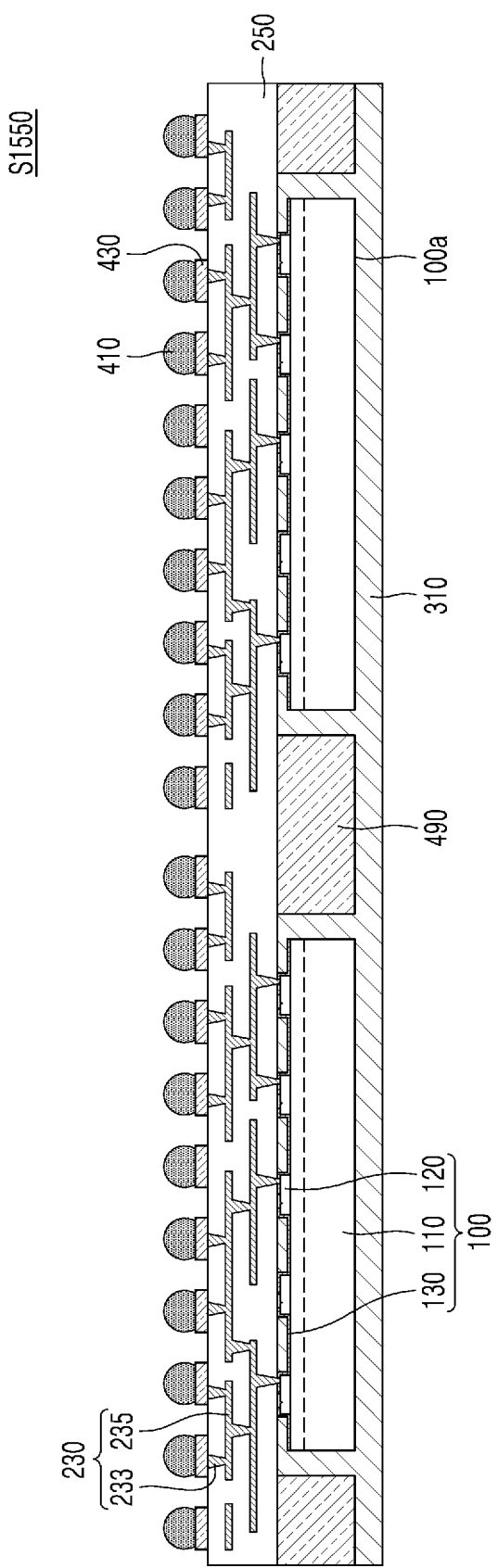

Referring to FIGS. 10, 19, and 20, according to an example embodiment, the method S100 of manufacturing the semiconductor device 1 may include forming the package connection terminal 410 in operation S1500.

Operation S1500 may include forming the package connection pad 430 on the redistribution structure 200 in operation 51530 and attaching the package connection terminal 410 to the package connection pad 430 in operation 51550.

The package connection pad 430 may be formed on the redistribution structure 200 to be connected to the redistribution via pattern 233 of the redistribution pattern 230 in operation 51530. The package connection pad 430 may be formed by a normal photolithography process, an etching process, a plating process, and the like.

The package connection terminal 410 may be melted by a reflow process and bonded to the package connection pad 430 in operation 51550. The package connection terminal 410 may include a metal solder ball including at least one selected from Sn, Ag, Cu, and Al.

Figure 21:
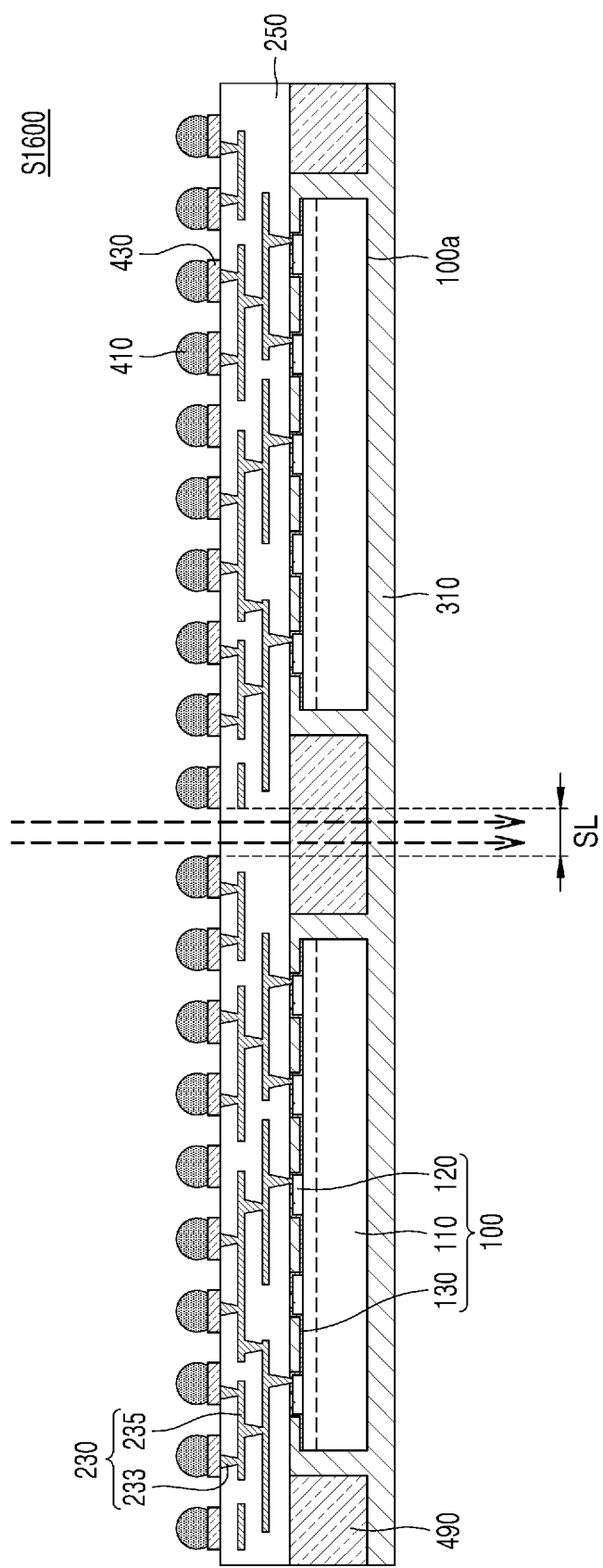

Referring to FIGS. 10 and 21, according to an example embodiment, the method S100 of manufacturing the semiconductor device 1 may include singulating the semiconductor package 20 in operation S1600.

A scribe lane SL of the resultant structure of FIG. 20 may be cut in operation S1600. In an example embodiment, the scribe lane SL may be cut using a blade wheel in operation S1600.

However, embodiments are not limited thereto. For example, the scribe lane SL may be cut using a laser in operation S1600. For example, the scribe lane SL may be cut by emitting light from a laser into the scribe lane SL in operation S1600.

After operation S1600, the semiconductor package 20 (of FIG. 4) may be completely manufactured, according to an example embodiment.

Figure 22:
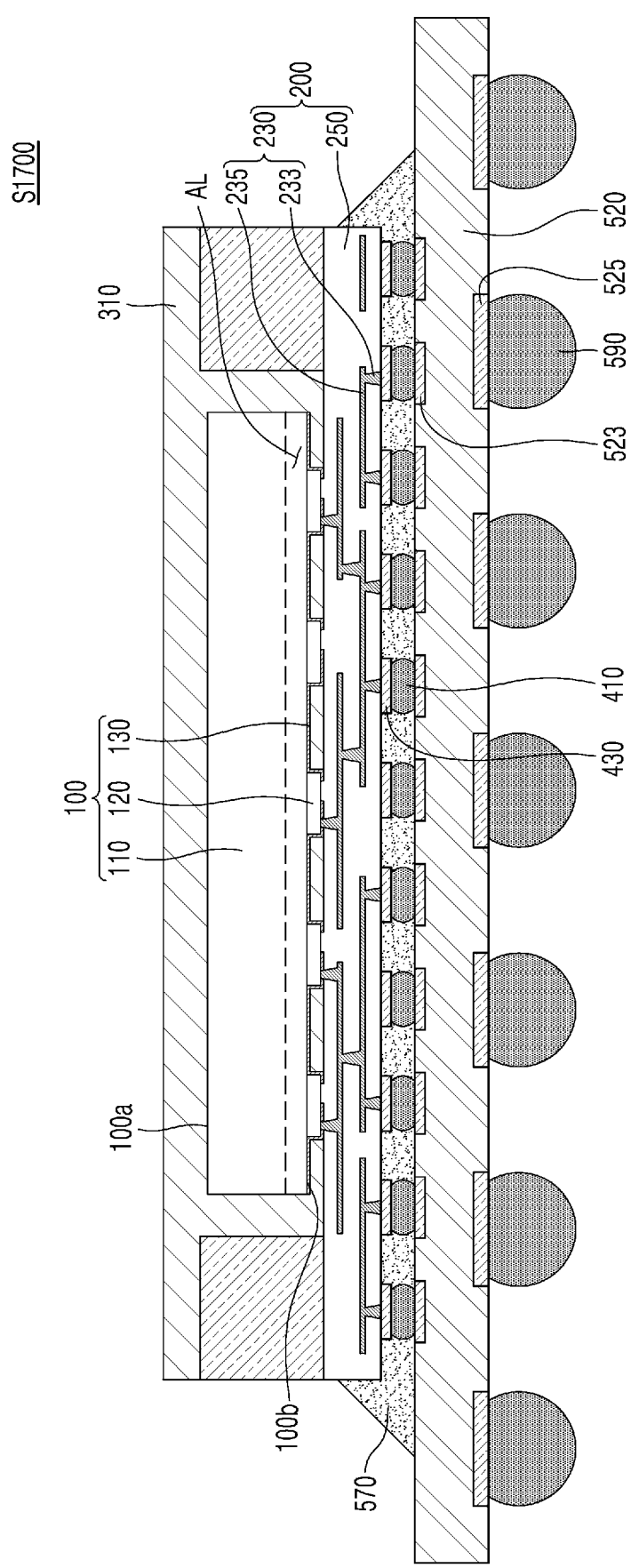

Referring to FIGS. 10 and 22, according to an example embodiment, the method S100 of manufacturing the semiconductor device 1 may include mounting the semiconductor package 20 on the package substrate 520 in operation S1700.

The semiconductor package 20 may be mounted on the package substrate 520 such that the package connection terminal 410 of the semiconductor package 20 is in contact with the first package substrate pad 523 of the package substrate 520 in operation S1700. Accordingly, the semiconductor chip 100 of the semiconductor package 20 may be electrically connected to the package substrate 520 through the chip pad 120, the redistribution pattern 230, the package connection terminal 410, and the first package substrate pad 523.

The underfill layer 570 may be formed between the semiconductor package 20 and the package substrate 520 in operation S1700. The underfill layer 570 may fix the semiconductor package 20 to the package substrate 520.

In an example embodiment, the underfill layer 570 may include any one or any combination of selected from an insulating polymer and epoxy resin. For example, the underfill layer 570 may include an EMC.

In an example embodiment, the underfill layer 570 may include chloride ions. For example, the underfill layer 570 may include at least 100 ppm chloride ions by weight.

After operation S1700, the semiconductor device 1 of FIG. 5 may be completely manufactured, according to an example embodiment.

As shown in FIG. 22, in the semiconductor device 1 manufactured by the method S100 according to an example embodiment, the underfill layer 570 may be in contact with the redistribution dielectric layer 250. For example, the underfill layer 570 may be in contact with the bottom surface of the redistribution dielectric layer 250 and at least a portion of the side surface of the redistribution dielectric layer 250.

Accordingly, the chloride ions in the underfill layer 570 may move into the redistribution dielectric layer 250. The chloride ions may also move in the redistribution dielectric layer 250. When the chloride ions permeate the chip pad 120, which includes a metal material, there is a risk that the chip pad 120 may corrode and that the structural reliability of the chip pad 120 and the redistribution via pattern 233 may be weakened.

According to an example embodiment, the edge of the connection portion 120_CA of the chip pad 120 of the semiconductor chip 100 may be surrounded by the barrier layer 130, and the first opening 130_O1 (i.e., the central portion of the connection portion 120_CA of the chip pad 120) of the barrier layer 130 may be filled with the redistribution via pattern 233.

In other words, a portion of the surface of the chip pad 120 adjacent to the connection portion 120_CA may not be in direct contact with the redistribution dielectric layer 250. Therefore, the chloride ions moving in the redistribution dielectric layer 250 may not permeate the chip pad 120, and accordingly, the chip pad 120 may be prevented from corroding and the structural reliability of the chip pad 120 and the redistribution via pattern 233 may be enhanced.

While aspects of example embodiments have been particularly shown and described, it will be understood that various changes in form and details may be made therein without departing from the spirit and scope of the following claims.

What is claimed is:

1. A semiconductor package comprising:
   a chip pad of a semiconductor chip, the chip pad comprising a connection portion and a test portion in a first surface of the chip pad;
   a barrier layer covering the chip pad, the barrier layer defining a first opening and a second opening that is separate from the first opening, the first opening exposing the connection portion of the chip pad, and the second opening exposing the test portion of the chip pad; and
   a redistribution structure connected to the chip pad and comprising a redistribution dielectric layer, a redistribution via pattern, and a redistribution line pattern, the redistribution dielectric layer covering the chip pad and the barrier layer, the redistribution via pattern passing through at least a portion of the redistribution dielectric layer in a vertical direction, filling the first opening and being in contact with the connection portion of the chip pad, and the redistribution line pattern extending in a horizontal direction between, along the vertical direction, portions of the redistribution dielectric layer, and being connected to the redistribution via pattern.

2. The semiconductor package of claim 1, wherein the redistribution dielectric layer fills a contact test groove formed in the test portion of the chip pad.

3. The semiconductor package of claim 1, wherein, in a plan view of the semiconductor package, a size of the first opening of the barrier layer is less than a size of the second opening of the barrier layer.

4. The semiconductor package of claim 3, wherein, in the plan view of the semiconductor package, the connection portion of the chip pad is surrounded by a sidewall of the first opening of the barrier layer and has a circular shape, and
   the test portion of the chip pad is surrounded by a sidewall of the second opening of the barrier layer and has a quadrangular shape.

5. The semiconductor package of claim 4, wherein, in the plan view of the semiconductor package,
   a width of the connection portion of the chip pad surrounded by a sidewall of the first opening of the barrier layer is about 10 micrometers to about 50 micrometers, and
   a width of the test portion of the chip pad surrounded by a sidewall of the second opening of the barrier layer is about 40 micrometers to about 100 micrometers.

6. The semiconductor package of claim 1, wherein the redistribution via pattern has a tapered structure having a horizontal cross-sectional area which decrease toward the chip pad,
   a first portion of the redistribution via pattern is surrounded by the barrier layer and in contact with the connection portion of the chip pad, and
   a second portion of the redistribution via pattern is surrounded by the redistribution dielectric layer.

7. The semiconductor package of claim 6, wherein a horizontal cross-sectional area of the second portion of the redistribution via pattern is greater than a horizontal cross-sectional area of the first opening of the barrier layer.

8. The semiconductor package of claim 1, wherein the redistribution structure further comprises a redistribution seed layer interposed between the redistribution via pattern and the redistribution dielectric layer and between the redistribution line pattern and the redistribution dielectric layer.

9. A semiconductor package comprising:
   a chip pad of a semiconductor chip, the chip pad comprising a connection portion and a test portion in a first surface of the chip pad;
   a barrier layer covering the chip pad, the barrier layer defining a first opening and a second opening that is separate from the first opening, the first opening exposing the connection portion of the chip pad, and the second opening exposing the test portion of the chip pad;
   a capping layer provided on the barrier layer and filling the first opening and the second opening of the barrier layer; and
   a redistribution structure connected to the chip pad and comprising a redistribution dielectric layer, a redistribution via pattern, and a redistribution line pattern, the redistribution dielectric layer covering the barrier layer and the capping layer, the redistribution via pattern passing through at least a portion of the redistribution dielectric layer in a vertical direction and being in contact with a portion of the capping layer, and the redistribution line pattern extending in the redistribution dielectric layer in a horizontal direction and being connected to the redistribution via pattern.

10. The semiconductor package of claim 9, wherein the connection portion and the test portion of the chip pad are in contact with the capping layer, and the capping layer fills a concave test groove formed in the test portion of the chip pad.

11. The semiconductor package of claim 9, wherein the capping layer comprises a material having less reactivity than a material of the chip pad.

12. The semiconductor package of claim 9, wherein a thickness of the capping layer is about 1 micrometer to about 5 micrometers.

13. The semiconductor package of claim 9, wherein the capping layer comprises:
   a capping seed layer conformally formed on a surface of the barrier layer and a surface of the chip pad; and
   a capping conductive layer comprising a conductive material provided on the capping seed layer.

14. The semiconductor package of claim 9, wherein, in a plan view of the semiconductor package, a size of the first opening of the barrier layer is less than a size of the second opening of the barrier layer.

15. The semiconductor package of claim 9, wherein the redistribution via pattern has a tapered structure having a horizontal cross-sectional area which decreases toward the chip pad, and
   the redistribution structure further comprises a redistribution seed layer interposed between the redistribution via pattern and the redistribution dielectric layer and between the redistribution line pattern and the redistribution dielectric layer.

16. A semiconductor package comprising:
   a semiconductor chip comprising a semiconductor substrate, a chip pad provided on the semiconductor substrate and a barrier layer provided on the chip pad, a first surface of the chip pad comprising a connection portion and a test portion, a second surface of the chip pad that is opposite the first surface being in contact with an active layer of the semiconductor substrate, a concave test groove being formed in the test portion of the first surface, the barrier layer defining a first opening and a second opening that is separate from the first opening, the first opening exposing the connection portion of the chip pad, and the second opening exposing the test portion of the chip pad;
   a redistribution structure connected to the chip pad and comprising a redistribution dielectric layer, a redistribution via pattern, and a redistribution line pattern, the redistribution dielectric layer covering the chip pad and the barrier layer, the redistribution via pattern passing through at least a portion of the redistribution dielectric layer in a vertical direction and being electrically connected to the connection portion of the chip pad, and the redistribution line pattern extending in a horizontal direction between, along the vertical direction, portions of the redistribution dielectric layer, and being electrically connected to the redistribution via pattern; and
   a molding layer provided on the redistribution structure and surrounding the semiconductor chip.

17. The semiconductor package of claim 16, further comprising a plurality of package connection terminals provided on the redistribution structure and connected to the redistribution via pattern,
   wherein along the horizontal direction, a side surface of the semiconductor chip is interposed between two of the plurality of package connection terminals.

18. The semiconductor package of claim 16, wherein the redistribution via pattern fills the first opening of the barrier layer and is in contact with the connection portion of the chip pad,
   a first portion of the redistribution via pattern is surrounded by the barrier layer, and
   a second portion of the redistribution via pattern is surrounded by the redistribution dielectric layer.

19. The semiconductor package of claim 16, further comprising a capping layer provided on the barrier layer and filling the first opening and the second opening of the barrier layer,
   wherein the redistribution via pattern is in contact with a surface of the capping layer.

20. The semiconductor package of claim 19, wherein the capping layer comprises:
   a capping seed layer conformally formed on a surface of the barrier layer and a surface of the chip pad; and
   a capping conductive layer comprising a conductive material provided on the capping seed layer,
   wherein a material of the capping seed layer comprises titanium or titanium tungsten, and
   a material of the capping conductive layer comprises copper.

* * * * *